United States Patent
Roy et al.

(10) Patent No.: US 8,451,675 B2
(45) Date of Patent: May 28, 2013

(54) METHODS FOR ACCESSING DRAM CELLS USING SEPARATE BIT LINE CONTROL

(75) Inventors: Richard S. Roy, Dublin, CA (US); Dipak K. Sikdar, Santa Clara, CA (US)

(73) Assignee: MoSys, Inc., Santa Clara, CA (US)

( * ) Notice: Subject to any disclaimer, the term of this patent is extended or adjusted under 35 U.S.C. 154(b) by 204 days.

(21) Appl. No.: 13/077,811

(22) Filed: Mar. 31, 2011

(65) Prior Publication Data

US 2012/0250442 A1    Oct. 4, 2012

(51) Int. Cl.
*G11C 7/00* (2006.01)
(52) U.S. Cl.
USPC .................. 365/203; 365/189.16; 365/189.08
(58) Field of Classification Search
USPC ................... 365/203, 189.16, 189.08, 189.07, 365/227, 189.14, 230.06, 72, 63, 201, 226, 365/185.22
See application file for complete search history.

(56) References Cited

U.S. PATENT DOCUMENTS

| | | | |
|---|---|---|---|
| 5,278,799 A | 1/1994 | Uesugi | |
| 5,610,871 A | 3/1997 | Hidaka | |
| 7,420,862 B2 | 9/2008 | Hummler | |
| 8,009,488 B2 | 8/2011 | Park et al. | |
| 2003/0223267 A1 | 12/2003 | Han | |
| 2008/0310243 A1* | 12/2008 | Jung et al. | 365/203 |
| 2009/0080230 A1 | 3/2009 | Matick et al. | |
| 2009/0201718 A1 | 8/2009 | Kim | |
| 2010/0246235 A1* | 9/2010 | Gouin | 365/72 |
| 2011/0080796 A1 | 4/2011 | Bruennert et al. | |

* cited by examiner

*Primary Examiner* — Dang Nguyen
(74) *Attorney, Agent, or Firm* — Bever, Hoffman & Harms, LLP

(57) ABSTRACT

A memory system that includes a first bit line coupled to a first set of dynamic random access memory (DRAM) cells, a second (complementary) bit line coupled to a second set of DRAM cells, and a sense amplifier coupled to the first and second bit lines. The sense amplifier includes a pair of cross-coupled inverters (or a similar latching circuit) coupled between the first and second bit lines, as well as a first select transistor coupling the first bit line to a first global bit line, and a second select transistor coupling the second bit line to a second global bit line. The first and second select transistors are independently controlled, thereby enabling improved read and write access sequences to be implemented, whereby signal loss associated with bit line coupling is eliminated, 'read bump' conditions are eliminated, and late write conditions are eliminated.

22 Claims, 28 Drawing Sheets

US 8,451,675 B2

METHODS FOR ACCESSING DRAM CELLS USING SEPARATE BIT LINE CONTROL

RELATED APPLICATIONS

The present application is related to, and incorporates by reference, the following commonly owned, co-filed U.S. patent applications: Ser. No. 13/077,798 filed by Richard S. Roy and Dipak K. Sikdar on Mar. 31, 2011, entitled "Separate Pass Gate Controlled Sense Amplifier".

FIELD OF THE INVENTION

The present invention relates to a sense amplifier for a dynamic random access memory (DRAM) cells.

RELATED ART

FIG. 1A is a circuit diagram of a conventional eight transistor (8T) DRAM sense amplifier 100, which is coupled to DRAM cells 109-110 having PMOS access transistors (PMOS bit cells). DRAM sense amplifier 100 includes PMOS transistors 101-102 and NMOS transistors 103-108, which are connected as illustrated. PMOS transistors 101-102 and NMOS transistors 103-104 form a cross-coupled latch, which is coupled to PMOS bit cells 109 and 110 by complementary bit lines BL and BL#, respectively. The source and body regions of PMOS transistors 101-102 are coupled to receive a control voltage PS, and the source regions of NMOS transistors 103-104 are coupled to receive a control voltage NS. Transistors 107 and 108 couple the sources of NMOS transistors 103-104 to bit lines BL and BL#, respectively. An equalization signal EQ is applied to the gates of NMOS transistors 107 and 108. When the equalization signal EQ is activated high, NMOS transistors 107-108 turn on, thereby equalizing the voltages on bit lines BL/BL# (i.e., applying the control voltage NS to both bit lines BL/BL#). NMOS transistors 105-106 are select transistors, which couple bit lines BL and BL# to global bit lines GBL and GBL#, respectively. A select signal SEL is applied to the gates of NMOS select transistors 105-106.

FIG. 1B is a timing diagram 120, which illustrates the timing of a read access to the PMOS bit cell 109 coupled to bit line BL of FIG. 1A. Prior to time $T_A$, the equalization signal EQ is activated high, thereby turning on NMOS transistors 107-108 to pre-charge the bit lines BL/BL# to the control voltage NS. At this time, the control voltage NS has a voltage of 0.6 Volts, or $V_{CCH}$. Also prior to time $T_A$, the select signal SEL is deactivated low, such that NMOS select transistors 105 and 106 are turned off. The global bit lines GBL/GBL# are pre-charged to a Vdd supply voltage of 1.05 Volts prior to time $T_A$. A word line enable signal $WL_A$, which is applied to PMOS bit cell 109 (as well as other PMOS bit cells in the same row), is de-activated high prior to time $T_A$.

At time $T_A$, the equalization signal EQ is deactivated low, thereby turning off NMOS transistors 107-108 to disable the equalization circuit. Also at time $T_A$, the word line enable signal $WL_A$ is activated low, thereby accessing the PMOS bit cell 109. Under these conditions, the cell capacitor of the PMOS bit cell 109 generates a signal on the bit line BL. When the bit line BL is selected in this manner, the voltage on the complementary bit line BL# serves as a reference for the voltage developed on the bit line BL. (Conversely, when a bit cell coupled to the bit line BL# is selected, the voltage on the bit line BL serves as a reference for the voltage developed on the bit line BL#.) Ideally, the reference voltage on the complementary bit line BL# would be maintained at the pre-charged voltage of $V_{CCH}$ while the PMOS bit cell 109 coupled to the bit line BL is accessed. However, capacitive coupling between the bit lines BL and BL# undesirably causes the voltage on the reference bit line BL# to be pulled toward the voltage of the selected bit line BL (i.e., the voltage on the reference bit line BL# deviates from the pre-charged voltage of $V_{CCH}$). In the example illustrated by FIG. 1B, the accessed PMOS bit cell 109 pulls up the voltage on the selected bit line BL. That is, the capacitive coupling between bit lines BL/BL# causes the voltage on the reference bit line BL# to increase (above $V_{CCH}$) as illustrated. This capacitive coupling can result in up to 20-30% signal loss, undesirably requiring sensing periods that are up to 20% longer.

At time $T_B$, the difference between the voltages on bit lines BL and BL# becomes large enough to be reliably sensed. At this time, sense amplifier 100 is enabled by driving the control voltages PS and NS from $V_{CCH}$ (0.6 Volts) to Vdd (1.05 Volts) and ground (0 Volts), respectively. Under these conditions, the voltage on bit line BL is pulled up toward the Vdd supply voltage, and the voltage on bit line BL# is pulled down toward the ground supply voltage.

At time $T_C$, the select signal SEL is activated high (Vdd), thereby turning on NMOS select transistors 105-106 to couple the bit lines BL and BL# to the global bit lines GBL and GBL#, respectively. As described above, both of the global bit lines GBL and GBL# are pre-charged to the Vdd supply voltage of 1.05 Volts, and typically have a significantly larger capacitance than bit lines BL and BL#. Thus, when NMOS select transistor 105 turns on, the bit line BL and the global bit line GBL are both at the Vdd supply voltage of 1.05 Volts. However, when NMOS transistor 106 turns on, the bit line BL# is at a voltage between $V_{CCH}$ and 0 Volts (e.g., 0.45 Volts), and the global bit line GBL# is at the Vdd supply voltage (1.05 Volts). Under these conditions, the voltage on the global bit line GBL# is pulled down slightly (e.g., to a voltage of about 0.85 Volts), and the voltage on the bit line BL# is pulled up slightly. This increased voltage on the bit line BL# is referred to as a 'read bump'. This read bump undesirably extends the time required to pull the bit line BL# all the way down to the ground voltage (which is required to restore the full data value to the accessed bit cell 109). Although the example illustrated by FIG. 1B assumes that the PMOS bit cell 109 stores a logic '1' value, it is understood that a similar read bump exists when the PMOS bit cell 109 stores a logic '0' value.

At time $T_D$, a global sense amplifier (not shown) coupled to the global bit lines GBL/GBL# is enabled by activating a global sense amplifier enable signal GSAEN, thereby reading the data signals developed on global bit lines GBL/GBL#.

At time $T_E$, the select signal SEL is deactivated low, thereby turning off NMOS select transistors 105-106 and isolating the bit lines BL/BL# from the global bit lines GBL/GBL#. Under these conditions, bit line BL# is pulled all the way down to the ground supply voltage (through NMOS transistor 104). As a result, the voltages on bit lines BL/BL# reach a full signal swing (i.e., Vdd and ground).

At time $T_F$, the word line enable signal $WL_A$ is deactivated high, the equalization signal EQ is activated high, and the PS/NS control signals are driven to $V_{CCH}$ (0.6 Volts). As a result, the bit lines BL/BL# are both driven to the pre-charge voltage of $V_{CCH}$ by the end of the access period at time $T_G$. Note that the global bit lines GBL/GBL# are pre-charged to the Vdd supply voltage before the select signal SEL is activated high in a subsequent access cycle.

FIG. 1C is a timing diagram 130, which illustrates the timing of a write access to the PMOS bit cell 109. Times $T_A$-$T_C$ and $T_E$-$T_G$ in FIGS. 1B and 1C occur at the same times during the illustrated access cycles. Note that non-written bit cells in the same row as the written bit cell 109 are subjected to the read access conditions of FIG. 1B during the write access of FIG. 1C. Thus, the write access of FIG. 1C is identical to the read access of FIG. 1B until time $T_C$, with the following exception. The data to be written to the PMOS bit cell 109 is driven onto the global bit lines GBL/GBL# prior to time $T_C$. In the illustrated example, the write data value is different than the data value stored in the PMOS bit cell 109 (i.e., the global bit line GBL is driven to the ground supply voltage and the global bit line GBL# is driven to the Vdd supply voltage).

FIG. 1C also illustrates the voltage on the storage node ($V_{SN}$) of the PMOS bit cell 109 being written. Prior to time $T_A$, the storage node voltage $V_{SN}$ is about 1.0 Volts. The storage node voltage $V_{SN}$ drops to about 0.8 Volts at time $T_B$ (as the storage node charges the bit line BL.) When the control voltages PS and NS are driven to Vdd and ground, respectively, starting at time $T_B$, the storage node voltage $V_{SN}$ subsequently increases to about 0.9 Volts at time $T_C$.

At time $T_C$, the select signal SEL is activated high (Vdd), thereby turning on NMOS select transistors 105-106 to couple the bit lines BL and BL# to the global bit lines GBL and GBL#, respectively. At this time, the bit line BL is pulled down towards the ground supply voltage by global bit line GBL, and the bit line BL# is pulled up towards the Vdd supply voltage by the global bit line GBL#. Note that the bit lines BL/BL# are not driven toward the Vdd and ground supply voltages until time $T_C$, which is relatively late in the write access cycle. As a result, the write access of FIG. 1C is sometimes referred to as a 'late write' operation.

At time $T_E$, the select signal SEL is deactivated low, thereby turning off NMOS select transistors 105-106 and isolating the bit lines BL/BL# from the global bit lines GBL/GBL#. The bit line BL is subsequently pulled all the way down to the ground supply voltage (through NMOS transistor 103), and bit line BL# is subsequently pulled all the way up to the Vdd supply voltage (through PMOS transistor 102).

At time $T_F$, the word line enable signal WL is deactivated high, the equalization signal EQ is activated high, and the PS/NS control signals are driven to $V_{CCH}$. As a result, the bit lines BL and BL# are pre-charged to $V_{CCH}$ by time $T_G$. However, at time $T_F$, the storage node voltage $V_{SN}$ of the PMOS bit cell 109 has not had sufficient time to reach the desired voltage of 0 Volts. Thus, the data value represented by the storage node voltage $V_{SN}$ is indeterminate. This incomplete write condition is typically remedied by extending the access period of the sense amplifier 100 (i.e., slowing down the operating frequency of the sense amplifier 100). Although the example illustrated by FIG. 1C assumes that the PMOS bit cell 109 initially stores a logic '1' value, and a logic '0' value is subsequently written to this PMOS bit cell 109, it is understood that a similar incomplete write condition will exist when the PMOS bit cell 109 initially stores a logic '0' value, and a logic '1' value is subsequently written to this PMOS bit cell 109.

It would therefore be desirable to have an improved sense amplifier design, which does not exhibit signal loss associated with bit line coupling, a read bump condition, or an incomplete write condition that results from a late write operation.

SUMMARY

Accordingly, the present invention provides a sense amplifier circuit that exhibits several new features, including: 1) the use of separate column select lines, 2) holding the reference bit line at a desired pre-charge voltage during a read access, and 3) performing an early write operation.

In accordance with one embodiment, a memory system includes a first bit line coupled to a first set of one or more DRAM cells, a second bit line coupled to a second set of one or more DRAM cells, and a sense amplifier coupled to the first and second bit lines, wherein the sense amplifier includes: a pair of cross-coupled inverters coupled between the first and second bit lines, a first select transistor coupling the first bit line to a first global bit line, a second select transistor coupling the second bit line to a second global bit line, a first select line coupled to a gate of the first select transistor, and a second select line coupled to a gate of the second select transistor, wherein the first control line is separate from the second control line.

This memory system allows for several improved methods for accessing the DRAM cells. In accordance with one embodiment, the first and second bit lines are initially driven to a pre-charge voltage. After the first and second bit lines are pre-charged, the first bit line is isolated from the pre-charge voltage, and a DRAM cell coupled to the first bit line is enabled, thereby developing a read voltage on the first bit line. During this time, the second bit line continues to be driven to the pre-charge voltage, such that there is no signal loss on due to capacitive coupling between the first and second bit lines. As a result, the read access time is improved with respect to the prior art.

After the read voltage has been developed on the first bit line, the second bit line is no longer driven to the pre-charge voltage, and the sense amplifier is enabled, whereby the enabled sense amplifier drives the voltages on the first and second bit lines to a full signal swing in response to the read voltage on the first bit line.

In accordance with another embodiment of the present invention, a first global bit line and a second global bit line are driven to the pre-charge voltage. After the first and second bit lines have been driven to the full signal swing by the sense amplifier, the second bit line is coupled to the second global bit line, thereby developing a global read voltage on the second global bit line. At this time, a global sense amplifier is enabled to sense the differential voltages developed on the first and second global bit lines. However, the first bit line is electrically isolated from the first global bit line during the time that the global read voltage is being developed on the second global bit line. As a result, the 'read bump' is effectively removed from the first bit line, allowing the DRAM cell being read to be refreshed more quickly than in the prior art.

In accordance with another embodiment of the present invention, the first and second bit lines can initially be driven to different pre-charge voltages.

In accordance with yet another embodiment of the present invention, a write access is performed by initially driving a first global bit line from a pre-charge voltage to a first write voltage, and driving a second global bit line from the pre-charge voltage to a second write voltage, wherein the pre-charge voltage is intermediate the first and second write voltages. A first bit line is coupled to the first global bit line, wherein the first bit line is coupled to the DRAM cell being written. A second bit line is coupled to the second global bit line. As a result, the first and second bit lines are initially pre-charged to the first and second write voltages, respectively. The first bit line is then isolated from the first global bit line, and the DRAM cell being written is enabled. Under these conditions, the voltage on the storage node of the DRAM cell is pulled toward the first write voltage, advantageously initiating an early write condition. The second bit line continues to be driven to the second write voltage while the storage node voltage of the DRAM cell is being pulled toward the first write voltage. The second bit line is subsequently isolated from the second global bit line, and a sense amplifier coupled to the first and second bit lines is enabled, such that the sense amplifier drives the first bit line to the first write voltage and the second bit line to the second write voltage. Under these conditions, the storage node voltage of the DRAM cell is actively driven toward the first write voltage, thereby completing the write operation relatively quickly (when compared with the 'late write' operation associated with the prior art sense amplifier 100). While a first set of selected DRAM cells in a row are being written in the manner described above, a second set on non-selected DRAM cells in the same row are subjected to read conditions.

The present invention will be more fully understood in view of the following description and drawings.

DETAILED DESCRIPTION

Figure 2A:
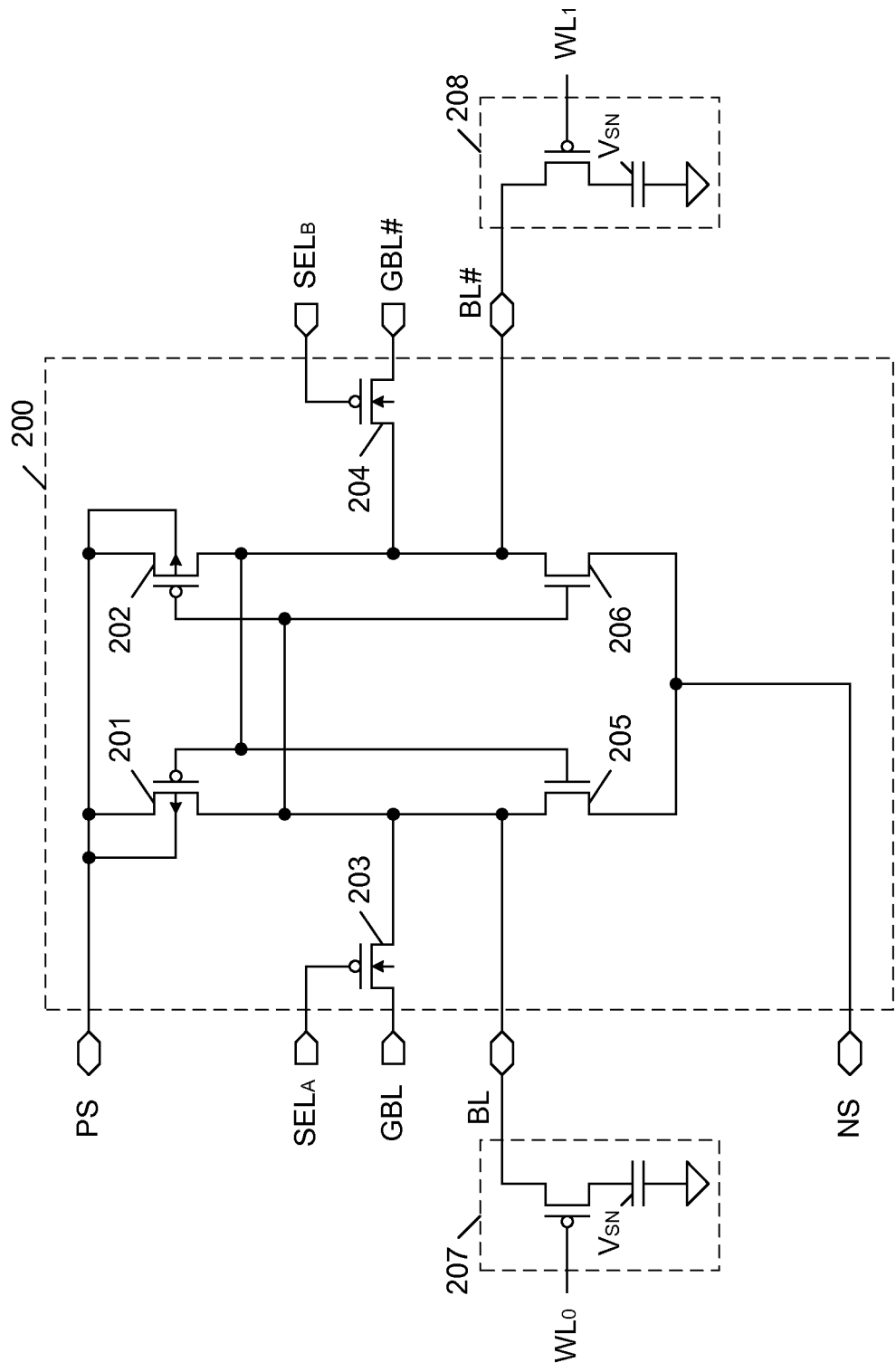
FIG. 2A is a circuit diagram of a six transistor (6T) sense amplifier circuit in accordance with one embodiment of the present invention.

FIG. 2A is a circuit diagram of a six transistor (6T) sense amplifier circuit 200 and PMOS bit cells 207-208 in accordance with one embodiment of the present invention. Sense amplifier 200 includes PMOS transistors 201-204 and NMOS transistors 205-206, which are connected as illustrated. Transistors 201 and 205 are connected to form a first inverter, and transistors 202 and 206 are connected to form a second inverter. These two inverters are cross-coupled to form a latch circuit, which is coupled to complementary bit lines BL and BL#. Exemplary PMOS bit cells 207 and 208 are shown coupled to bit lines BL and BL#, respectively, for purposes of illustration. It is understood that a plurality of bit cells are typically connected to each of the bit lines BL and BL#, wherein each of the bit cells has a corresponding word line.

The source and body regions of PMOS transistors 201-202 are coupled to receive a control voltage PS. The source regions of NMOS transistors 205-206 are coupled to receive a control voltage NS. PMOS transistors 203 and 204 are select transistors, which couple bit lines BL and BL# to global bit lines GBL and GBL#, respectively. Although not illustrated in FIG. 2A, the body regions of PMOS transistors 203-204 are coupled to receive the positive supply voltage $V_{DD}$. A first select signal $SEL_A$ is applied to the gate of PMOS select transistor 203, and a second select signal $SEL_B$ is applied to the gate of PMOS select transistor 204. It is important to note that the sense amplifier 200 implements separate column select signals ($SEL_A$ and $SEL_B$). In accordance with one embodiment, PMOS transistors 203 and 204 each has a relatively thick gate dielectric layer (i.e., compared with PMOS transistors 201-202 and NMOS transistors 205-206) to allow for wider voltage swings to be applied at their respective gates. In an alternate embodiment, PMOS select transistors 203 and 204 can be replaced with NMOS transistors.

Figure 1A:
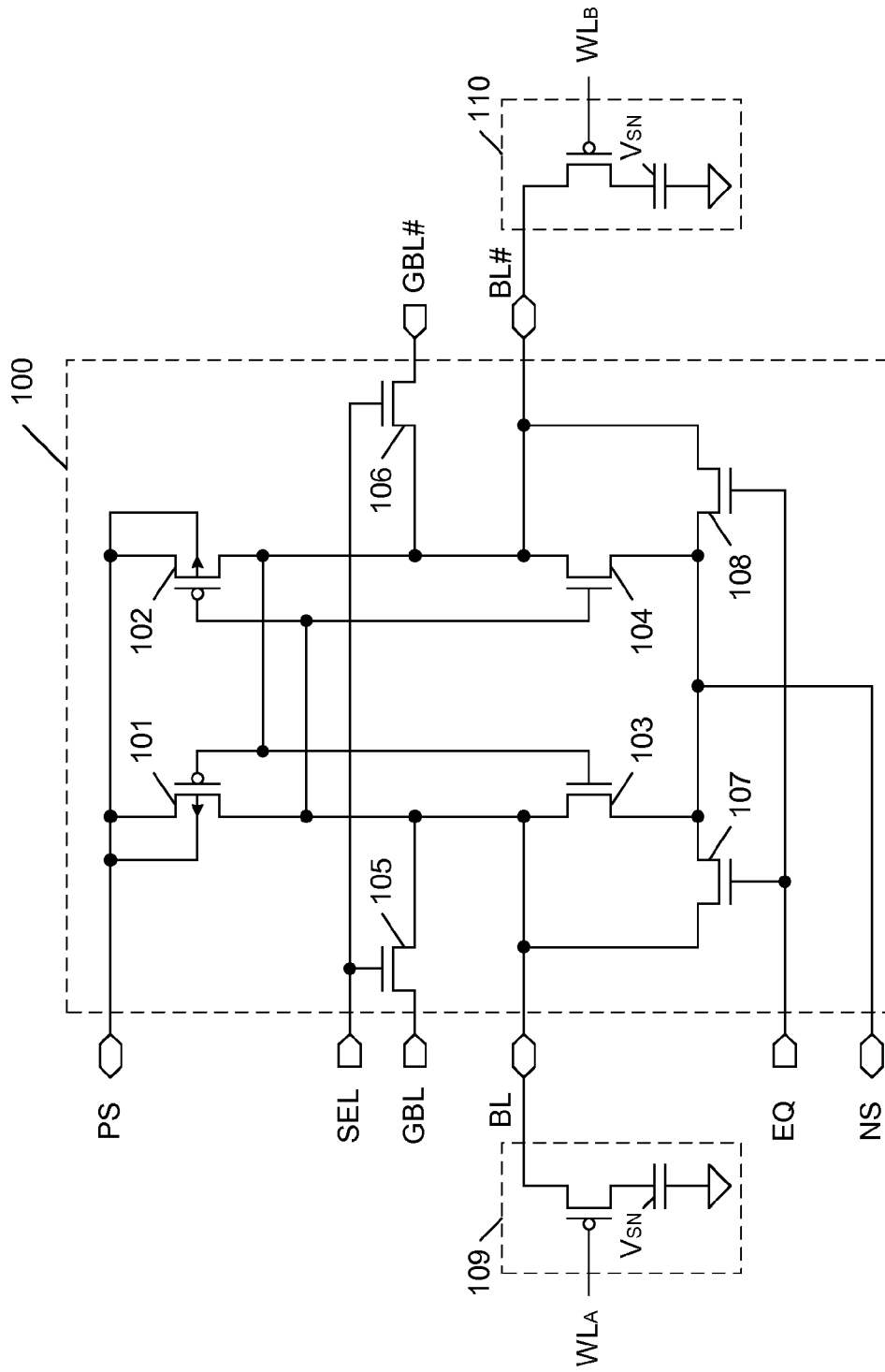
FIG. 1A is a circuit diagram of a conventional sense amplifier circuit.

Because of the two distinct column select lines, the sense amplifier 200 may have a larger layout than the prior art sense amplifier 100 (FIG. 1A). However, as described in more detail below, the two column select lines of sense amplifier 200 provide faster access speeds than the prior art sense amplifier 100 by eliminating the coupling between bit lines BL/BL# during read accesses.

In the described embodiments, each column of the associated DRAM array includes a bit line (e.g., BL) coupled to a corresponding global bit line (e.g., GBL). That is, the number of bit lines is equal to the number of global bit lines in the described embodiments.

Figure 2B:
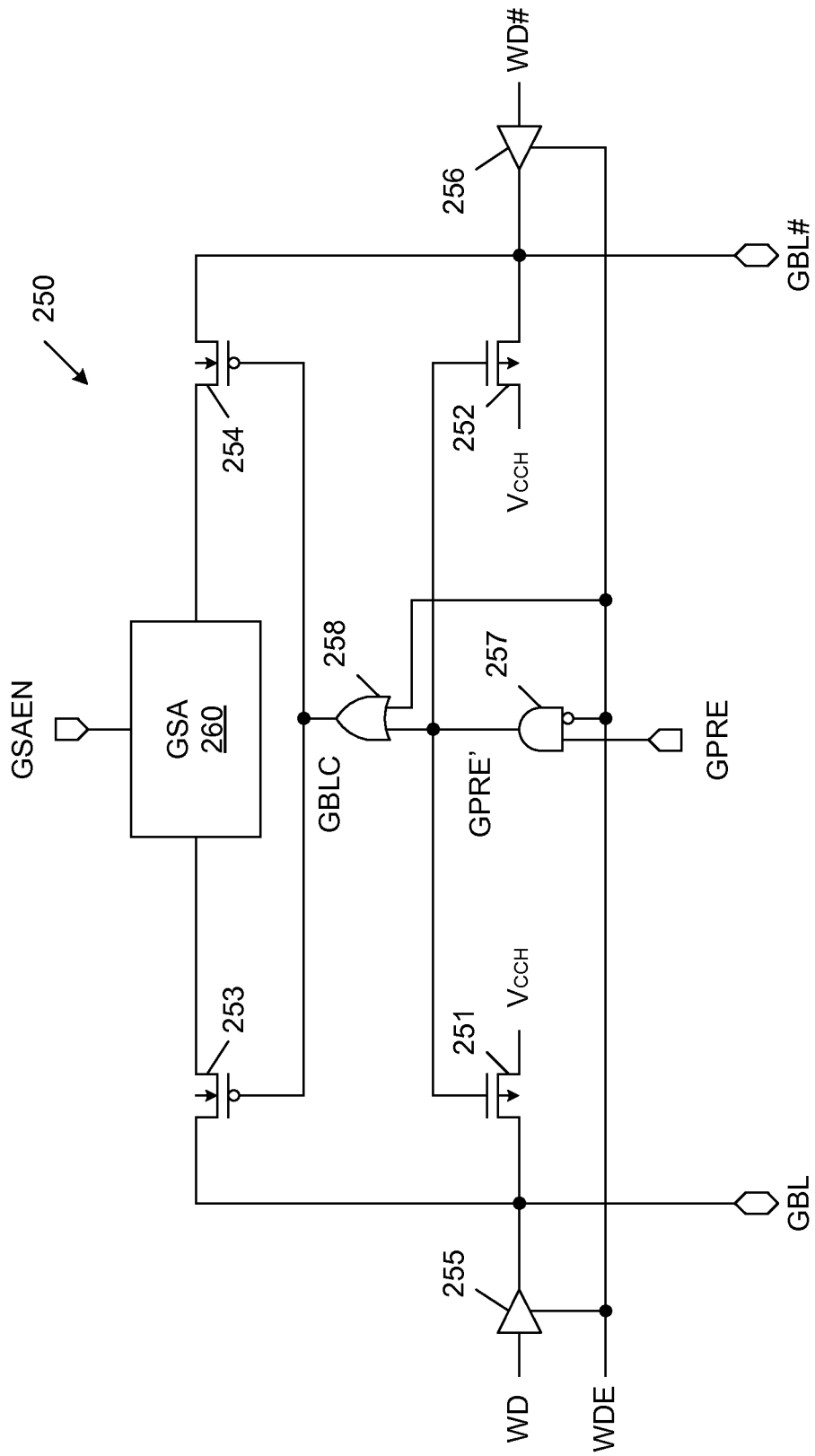
FIG. 2B is a circuit diagram of a global sense amplifier circuit, which is coupled to the sense amplifier circuit of FIG. 2A in accordance with one embodiment of the present invention.

FIG. 2B is a circuit diagram illustrating a global sense amplifier/write driver circuit 250, which is coupled to the global bit lines GBL/GBL# in accordance with one embodiment of the present invention. Global sense amplifier/write driver circuit 250 includes NMOS transistors 251-252, PMOS transistors 253-254, tri-state write drivers 255-256, logical AND gate 257, logical OR gate 258 and global sense amplifier 260. The drains of NMOS transistors 251 and 252 are coupled to the global bit lines GBL and GBL#, respectively, while the sources of NMOS transistors 251-252 are coupled to receive a pre-charge voltage ($V_{CCH}$) of about 0.6 Volts. PMOS transistors 253 and 254 couple the global bit lines GBL and GBL#, respectively, to global sense amplifier 260. Global sense amplifier 260 is enabled and disabled in response to a global sense amplifier enable signal GSAEN. In one embodiment, global sense amplifier 260 includes cross-coupled inverters similar to those found in sense amplifier 200, wherein that the global sense amplifier enable signal GSAEN controls signals similar to the PS and NS control voltages.

Write drivers 255 and 256 are coupled to global bit lines GBL and GBL#, respectively. Write drivers 255 and 256 are enabled/disabled in response to a write driver enable signal WDE. The write driver enable signal WDE is applied to write drivers in all columns associated with the same data word. In one embodiment, there are a plurality of write driver enable signals (not shown), wherein each write driver enable signal is coupled to write drivers in a plurality of columns associated with a corresponding data word.

The write driver enable signal WDE is applied to an inverting input of AND gate 257, and a global pre-charge signal GPRE is applied to a non-inverting input of AND gate 257. In response, AND gate 257 provides a column pre-charge signal GPRE' to the gates of NMOS transistors 251-252. OR gate 258 is coupled to receive the write driver enable signal WDE and the column pre-charge signal GPRE', and in response, provide global bit line coupling signal GBLC to the gates of PMOS transistors 253-254.

Figure 3A:
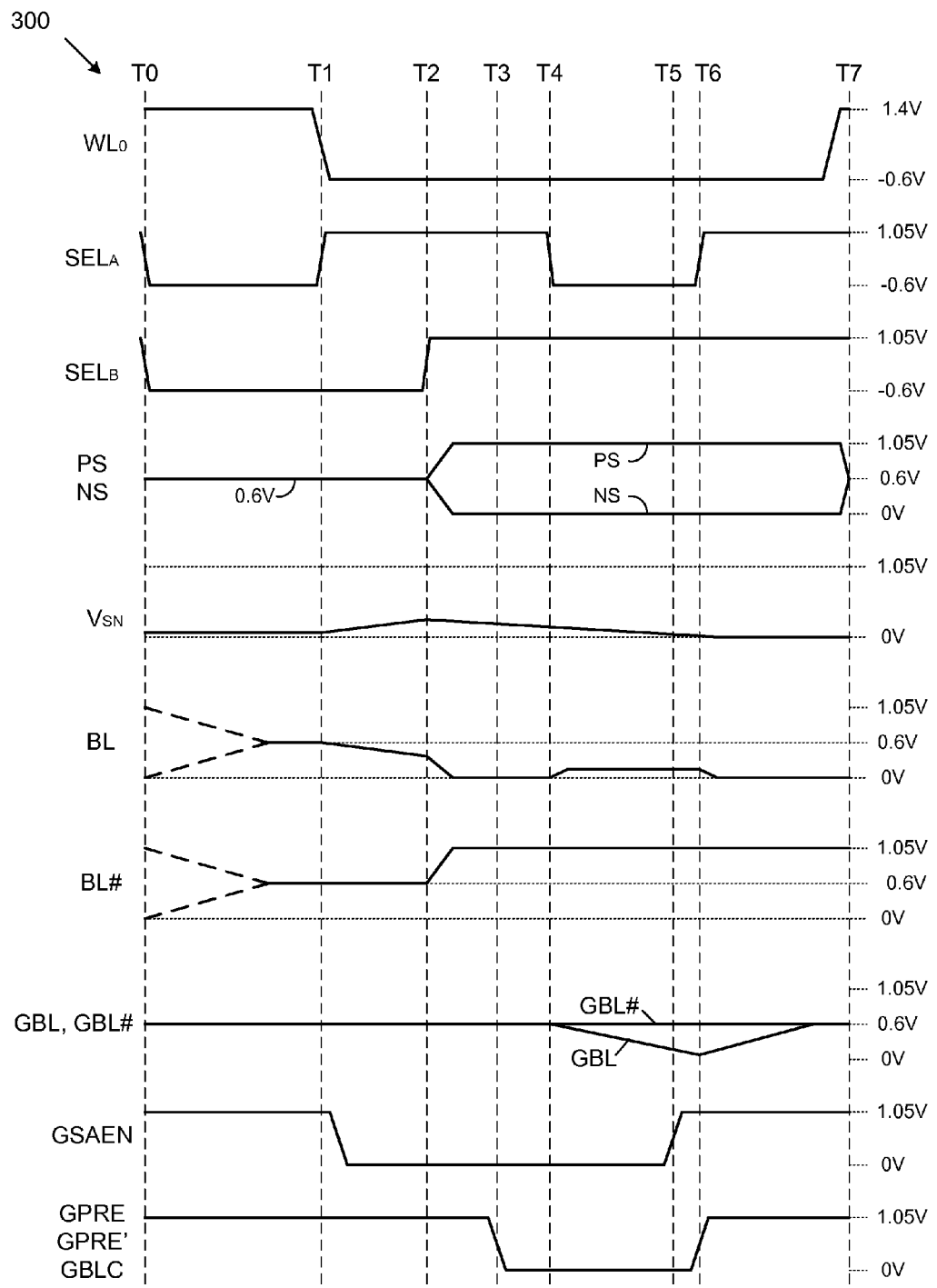
FIGS. 3A, 3B, 3C and 3D are waveform diagrams illustrating various read accesses implemented by the sense amplifier circuit of FIG. 2A and the global sense amplifier circuit of FIG. 2B in accordance with one embodiment of the present invention.

FIG. 3A is a waveform diagram 300 illustrating a read access implemented by sense amplifier 200 in accordance with one embodiment of the present invention. Waveform diagram 300 illustrates a read access to the PMOS bit cell 207. Waveform diagram 300 assumes that the storage node of PMOS bit cell 207 stores a logic low voltage ($V_{SN} \approx 0$ Volts). At the start of the read access cycle (T0), the word line signal $WL_0$ is de-activated high (note that the word line signal $WL_1$ is de-activated high throughout the entire read access). The write driver enable signal WDE (not shown) is de-activated to a logic '0' state, thereby causing the write drivers 255-256 to have a high-impedance (i.e., are 'tri-stated') during the read access. The logic '0' state of the write driver enable signal WDE causes the global pre-charge signal GPRE to be routed through AND gate 257 as the column pre-charge signal GPRE', and through OR gate 258 as the global bit line coupling signal GBLC. Within the global sense amplifier circuit 250, the global pre-charge signal GPRE (and therefore the column pre-charge signal GPRE' and the global bit line coupling signal GBLC) is activated high, thereby turning on transistors 251-252 and causing the global bit lines GBL and GBL# to be driven to the pre-charge voltage $V_{CCH}$ of 0.6 Volts. The activated global pre-charge signal GPRE also causes PMOS transistors 253-254 to turn off, such that the global sense amplifier 260 is isolated from the global bit lines GBL and GBL#. Note that the global sense amplifier signal GSAEN is already activated at time T0 to enable the global sense amplifier 260 to complete an access initiated during a previous cycle.

Also at time T0, the select signals $SEL_A$ and $SEL_B$ are activated low, thereby turning on PMOS transistors 203 and 204, respectively. As a result, bit lines BL and BL# are driven from their pre-existing states to the $V_{CCH}$ voltage of 0.6 Volts. Note that at time T0, the control signals PS and NS are each held at the voltage $V_{CCH}$ (0.6 V), such that the sense amplifier 200 is disabled.

By time T1, the bit lines BL/BL# have been driven to the $V_{CCH}$ voltage (i.e., pre-charged) from the global bit lines GBL/GBL#. At time T1, the select signal $SEL_A$ is de-activated high, thereby turning off PMOS transistor 203, effectively isolating the bit line BL from the global bit line GBL. Also at time T1, the word line enable signal $WL_0$ is activated low, thereby turning on the PMOS access transistor within PMOS bit cell 207. As a result, the low storage node voltage $V_{SN}$ of the PMOS bit cell 207 pulls the voltage on the bit line BL below the pre-charged voltage of 0.6 Volts. Note that the storage node voltage $V_{SN}$ is also pulled up slightly by the pre-charged bit line BL, due to charge sharing that occurs between the PMOS bit cell 207 and the bit line BL. The select signal $SEL_B$ remains activated low at time T1, such that PMOS transistor 204 remains on, and the voltage on complementary bit line BL# continues to be driven to the $V_{CCH}$ voltage of 0.6 Volts. That is, the voltage $V_{CCH}$ on the bit line BL# is not changed as a result of the capacitive coupling to bit line BL. Consequently, the magnitude of the signal change on the bit line BL is approximately 20-30 milli-Volts greater than that found in the prior art, thereby allowing for a faster read access cycle. Stated another way, the voltage difference across bit lines BL and BL# develops faster than in the prior art, thereby allowing a faster read access cycle.

Shortly after time T1, the global sense amplifier enable signal GSAEN is de-activated, thereby disabling the global sense amplifier 260 in preparation for the upcoming read access.

At time T2 (i.e., after the required read voltage has been developed on the bit line BL), the sense amplifier 200 is enabled by driving the control voltage PS toward the Vdd supply voltage (1.05 Volts), and driving the control voltage NS toward the ground supply voltage (0 Volts). The select signal $SEL_B$ is also de-activated high, thereby turning off PMOS transistor 204, and isolating bit line BL# from global bit line GBL#. Under these conditions, the voltage on the bit line BL is quickly pulled down to the ground supply voltage (through NMOS transistor 205), and the voltage on the bit line BL# is quickly pulled up to the Vdd supply voltage (through PMOS transistor 202). The ground supply voltage applied to the bit line BL pulls the storage node voltage $V_{SN}$ all the way to the ground supply voltage by the end of the read access cycle, thereby refreshing the PMOS bit cell 207.

At time T3, (i.e., when the select transistors 203-204 are both turned off) the global pre-charge signal GPRE (and therefore the column pre-charge signal GPRE' and the global bit line coupling signal GBLC) is de-activated low. As a result, NMOS transistors 251 and 252 within the global sense amplifier circuit 250 are turned off, such that the global bit lines GBL and GBL# are no longer driven to the $V_{CCH}$ voltage. In addition, the de-activated global pre-charge signal GPRE causes PMOS transistors 253 and 254 to turn on, thereby coupling the global bit lines GBL and GBL# to the global sense amplifier 260.

Figure 1B:
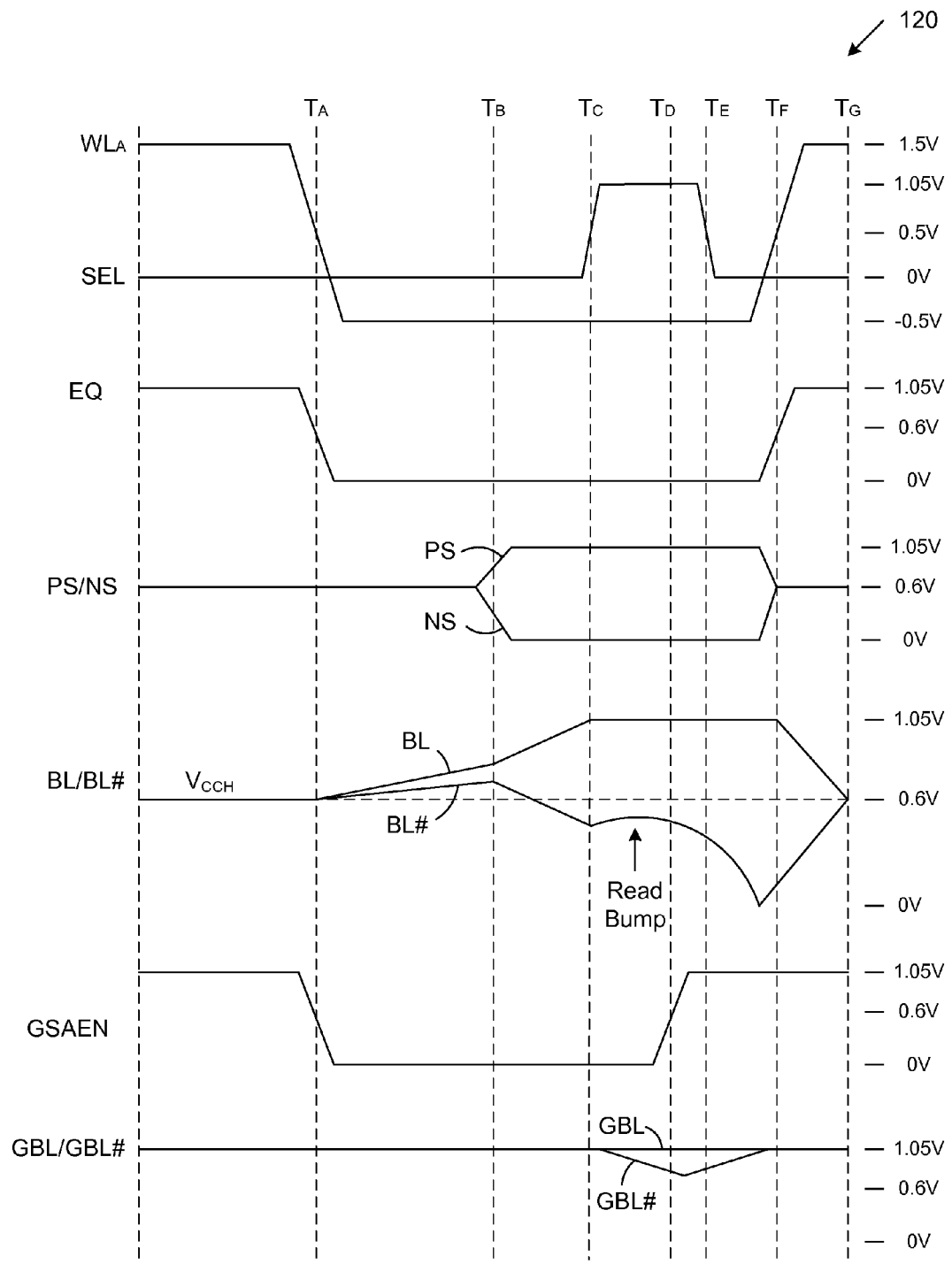
FIG. 1B is a waveform diagram illustrating a read access performed using the conventional sense amplifier circuit of FIG. 1A.
Figure 1C:
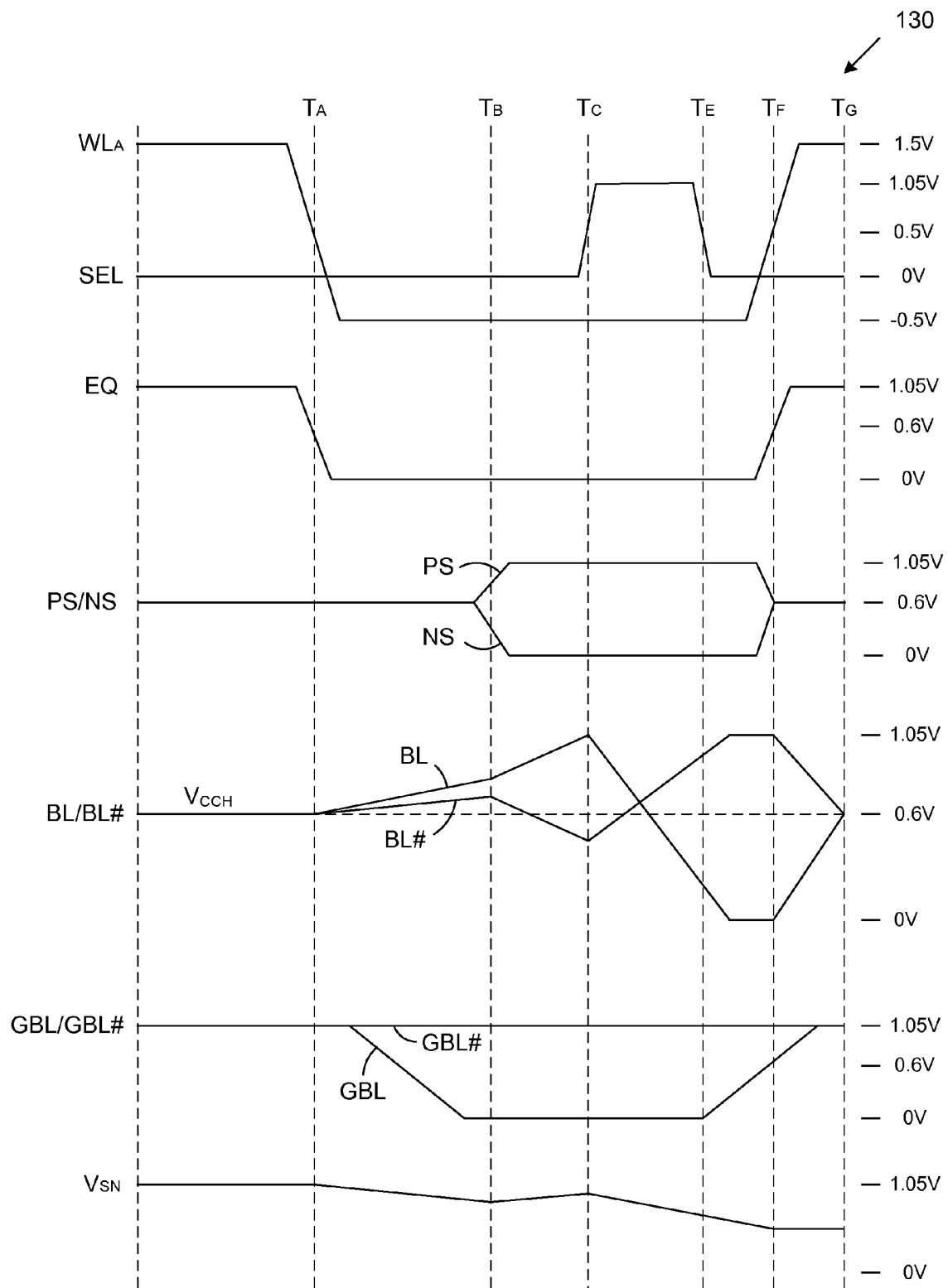
FIG. 1C is a waveform diagram illustrating a write access performed using the conventional sense amplifier circuit of FIG. 1A.

At time T4, the select signal $SEL_A$ is activated low, thereby turning on PMOS select transistor 203 to couple the bit line BL to the global bit line GBL. Under these conditions, the voltage on the global bit line GBL is pulled down from the pre-charge voltage of $V_{CCH}$ toward the ground supply voltage. Note that the voltage on the bit line BL is slightly pulled up in response to the pre-charged voltage $V_{CCH}$ on the global bit line GBL. However, because the voltage on bit line BL was pulled down all the way to the ground supply voltage at the time that the bit line BL is coupled to the global bit line GBL, the resulting 'read bump' in sense amplifier 200 is less severe than the 'read bump' that exists in prior art sense amplifier 100 (FIG. 1B).

At time T5, the global sense amplifier enable signal GSAEN is activated, thereby enabling global sense amplifier 260. As a result, global sense amplifier 260 amplifies (and latches) the signals developed on the global bit lines GBL/GBL#.

At time T6, the select signal $SEL_A$ is deactivated high, thereby turning off PMOS transistor 203 to isolate the bit line BL from the global bit line GBL. At this time, the voltage on the bit line BL is pulled all the way down to ground (by sense amplifier circuit 200).

Also at time T6, the global pre-charge signal GPRE (and therefore the column pre-charge signal GPRE' and the global bit line coupling signal GBLC) is activated high, thereby applying the $V_{CCH}$ voltage to global bit lines GBL and GBL#, and pre-charging these global bit lines to the $V_{CCH}$ voltage prior to the next access cycle, which begins at time T7. The activated global pre-charge signals GPRE also causes PMOS transistors 253-254 to turn off, such that the global sense amplifier 260 is de-coupled from the global bit lines GBL/GBL# when the global pre-charge signal GPRE is activated high. Note that global sense amplifier circuit 260 remains enabled, and provides the resulting read data value.

Prior to time T7 (i.e., the end of the read access cycle), the word line enable signal $WL_0$ is de-activated high, and then the PS and NS control signals are driven to the $V_{CCH}$ voltage, thereby disabling the sense amplifier 200.

Figure 3B:
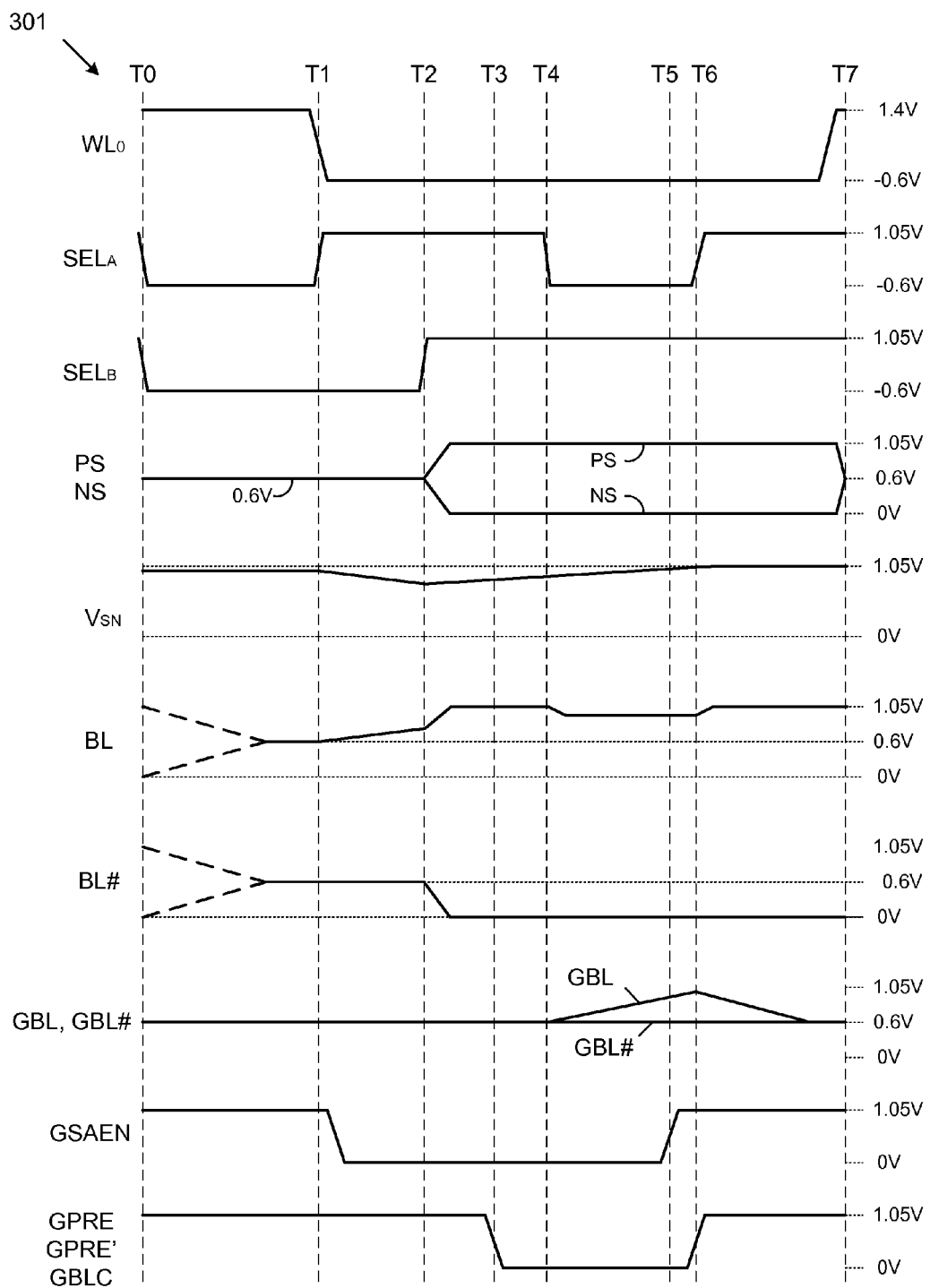

FIG. 3B is a waveform diagram 301 illustrating a read access to the PMOS bit cell 207, wherein the storage node of PMOS bit cell 207 stores a logic high voltage (e.g., $V_{SN} \approx 1.05$ Volts). Note that the bit line BL, the global bit line GBL and the storage node voltage $V_{SN}$ are pulled toward the Vdd supply voltage, and the bit line BL# is pulled toward the ground supply voltage in the waveform diagram 301 of FIG. 3B.

Figure 3C:
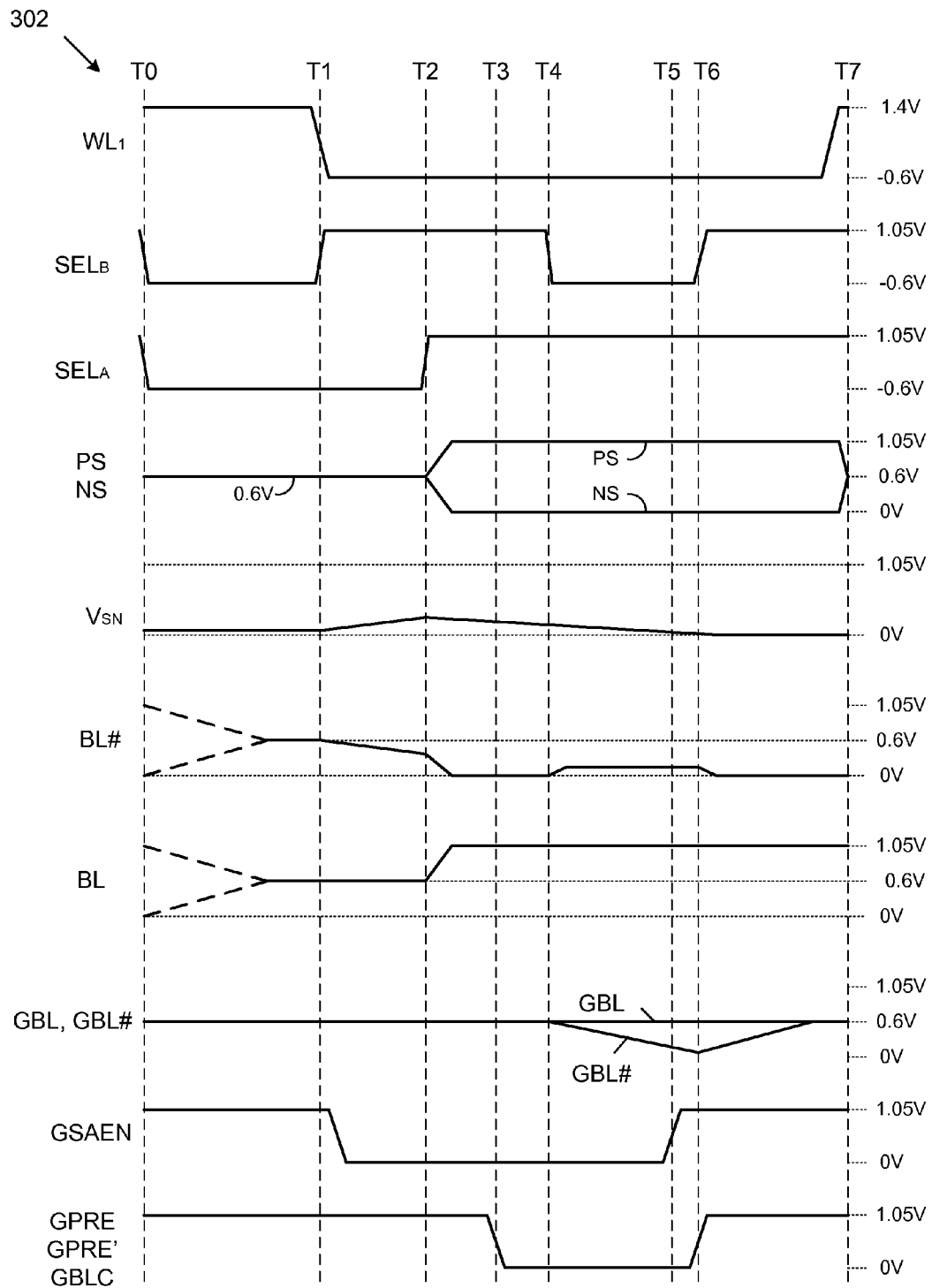

FIG. 3C is a waveform diagram 302 illustrating a read access to the PMOS bit cell 208, wherein the storage node of PMOS bit cell 208 stores a logic low voltage (e.g., $V_{SN} \approx 0$ Volts). The word line enable signal $WL_1$ is controlled in the same manner as the word line enable signal $WL_0$ in waveform diagrams 300-301 (and the word line enable signal $WL_0$ is de-activated for the duration of the read access associated with waveform diagram 302). The select signals $SEL_B$ and $SEL_A$ in waveform diagram 302 are controlled in the same manner as the select signals $SEL_A$ and $SEL_B$, respectively, in waveform diagrams 300-301. As a result, the voltage on the global bit line GBL# is pulled down toward ground during the read operation (while the voltage on the global bit line GBL remains at $V_{CCH}$).

Figure 3D:
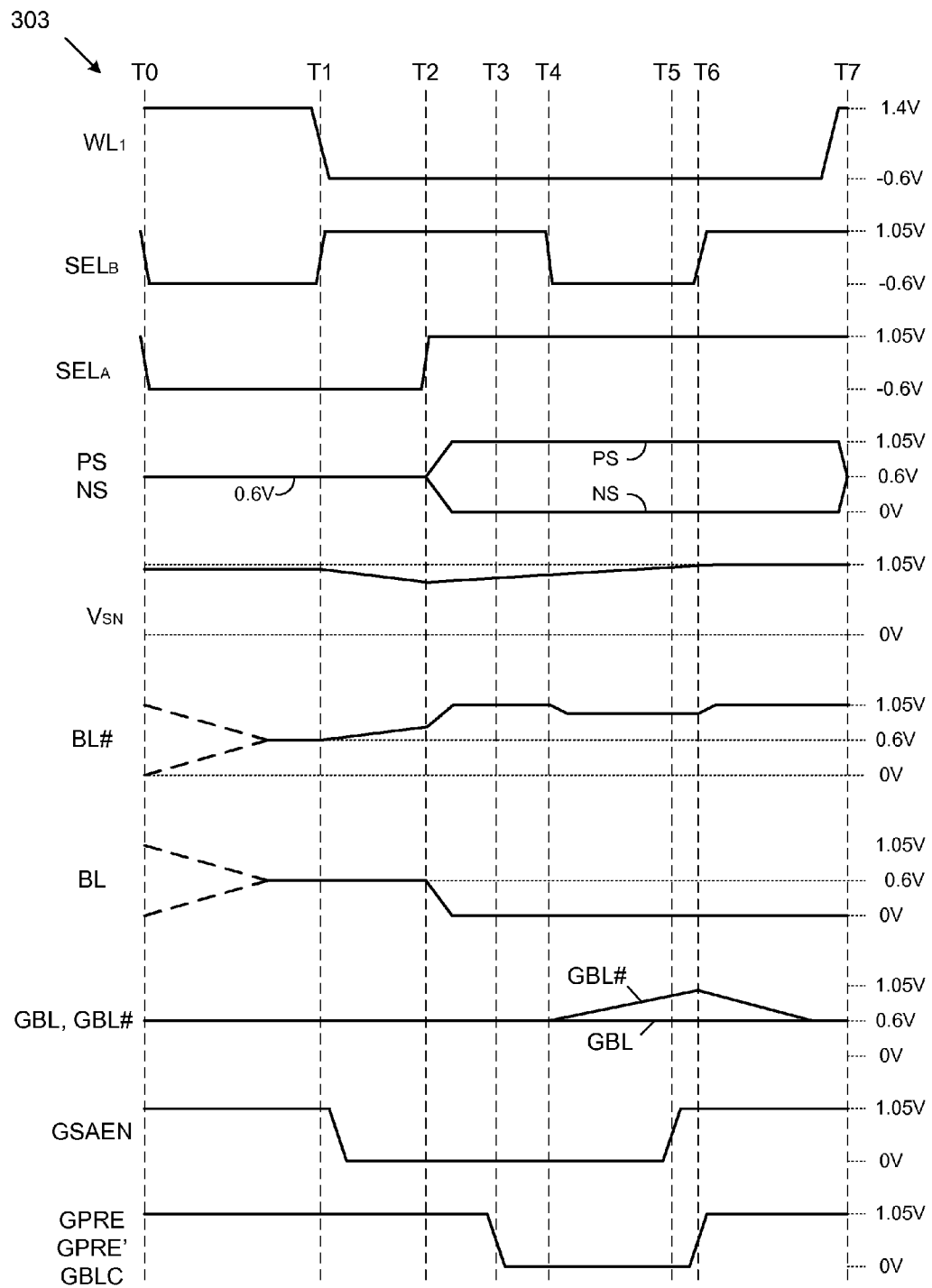

FIG. 3D is a waveform diagram 303 illustrating a read access to the PMOS bit cell 208, wherein the storage node of PMOS bit cell 208 stores a logic high voltage (e.g., $V_{SN} \approx 1.05$ Volts). Waveform diagram 303 is similar to waveform diagram 302 (but exhibits opposite logic states on the bit lines BL/BL#, the storage node voltage $V_{SN}$ and global bit line GBL#).

Write operations implemented by sense amplifier 200 and global sense amplifier circuit 250 will now be described.

Figure 4A:
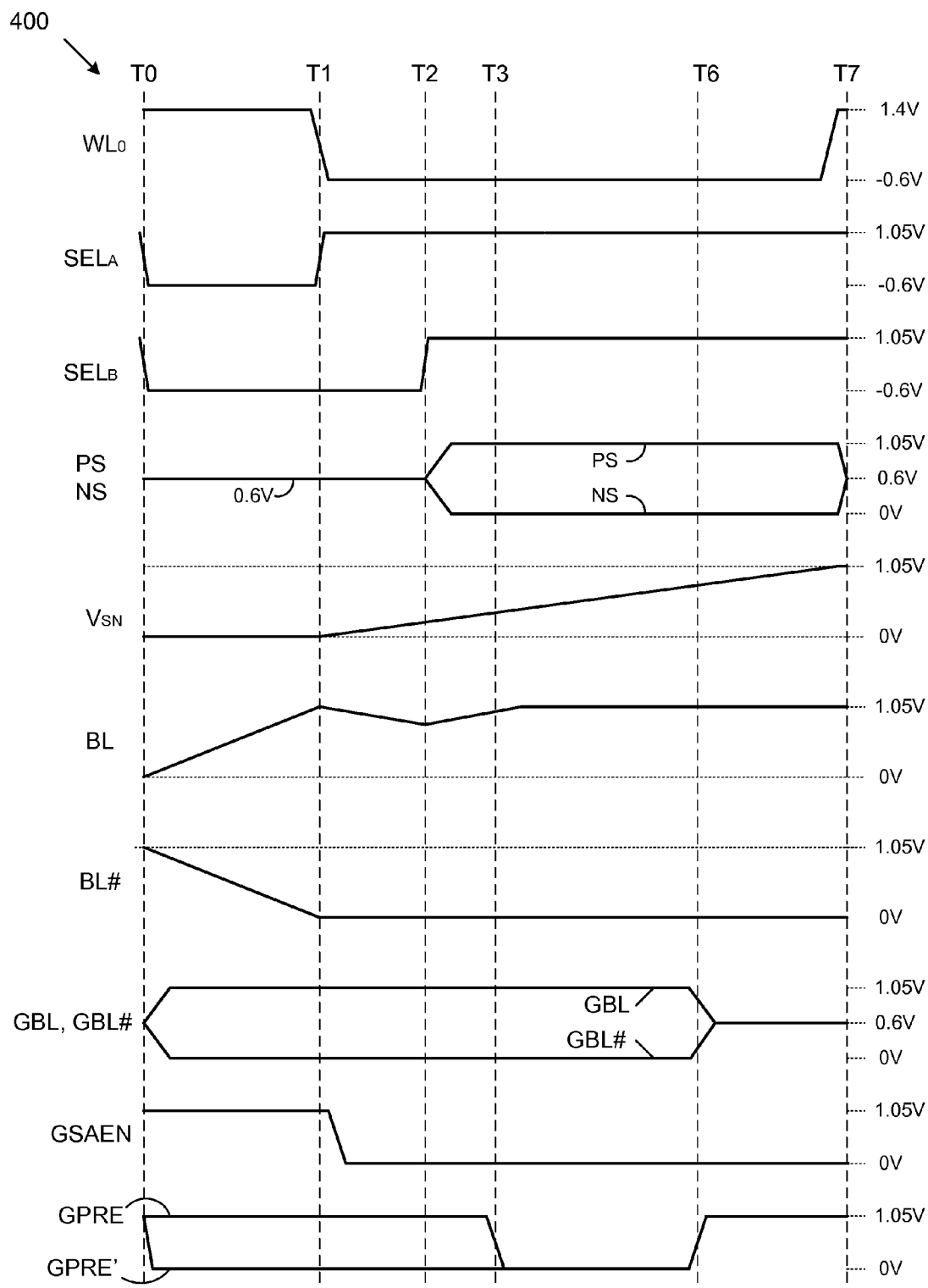
FIGS. 4A, 4B, 4C and 4D are waveform diagrams illustrating various write accesses implemented by the sense amplifier circuit of FIG. 2A and the global sense amplifier circuit of FIG. 2B in accordance with one embodiment of the present invention.

FIG. 4A is a waveform diagram 400 illustrating a write access implemented by sense amplifier 200 in accordance with one embodiment of the present invention. Waveform diagram 400 assumes that the storage node of PMOS bit cell 207 initially stores a logic low voltage ($V_{SN} \approx 0$ Volts), and that a logic high value is to be written to this PMOS bit cell 207 ($V_{SN} \approx 1.05$ Volt).

Times T0-T3 and T6-T7 in FIGS. 3A and 4A occur at the same times during the illustrated access cycles. As will become apparent in view of the following disclosure, the non-written bit cells in the same row (i.e., coupled to the same word line $WL_0$) as the written bit cell 207 are subjected to read access conditions during the write access of FIG. 4A, thereby refreshing these non-written bit cells.

The write access of FIG. 4A is identical to the read access of FIG. 3A until time T3, with the following exceptions. At time T0, the write driver enable signal WDE associated with the PMOS bit cell 207 is activated to a logic '1' state. Note that this write driver enable signal WDE is also be provided to write drivers associated with other columns of the DRAM array, such that multiple PMOS bit cells coupled to the word line $WL_0$ are written at the same time. Also note that write drivers associated with still other columns of the DRAM array may be controlled by other write driver enable signals, which are de-activated to a logic '0' state, thereby preventing PMOS bit cells in these columns from being written. As described in more detail below, these non-written PMOS bit cells coupled to the word line $WL_0$ are refreshed (read) during the described write operation.

The activated write driver enable signal WDE drives the global bit line coupling signal GBLC to a logic '1' state, thereby turning off PMOS transistors 253-254, such that the global sense amplifier 260 is isolated from the global bit lines GBL and GBL#. The activated write driver enable signal WDE also drives the column pre-charge signal GPRE' to a logic '0' state, thereby turning off NMOS transistors 251-252, such that the $V_{CCH}$ voltage is not applied to the global bit lines GBL/GBL#. The activated write driver enable signal WDE also enables the write drivers 255-256, and the data to be written to the PMOS bit cell 207 is driven onto the global bit lines GBL/GBL# by the write drivers 255-256. In the illustrated example, the global bit line GBL is driven to the Vdd supply voltage and the global bit line GBL# is driven to the ground supply voltage. Because the PMOS select transistors 203 and 204 are both on at this time, the voltages on the global bit lines GBL and GBL# are driven onto the bit lines BL and BL#, respectively. FIG. 4A indicates that the bit lines BL and BL# are initially at voltages 0 Volts and 1.05 Volts, respectively. However, it is understood that these bit lines BL and BL# may initially be at 1.05 Volts and 0 Volts, respectively, in view of a previous access implemented by the sense amplifier 200. By time T1, the bit lines BL and BL# are pulled all the way to the Vdd supply voltage and the ground supply voltage, respectively.

As described above, the write driver enable signal(s) associated with the non-written PMOS bit cells are deactivated low during the write access. As a result, the global pre-charge signal GPRE is routed as the column pre-charge signal GPRE' (and the global bit line coupling signal GBLC) within the global sense amplifier/write driver circuits associated with these non-written PMOS bit cells. That is, the non-written PMOS bit cells are subject to the same read conditions specified by FIG. 3A from time T0 to time T1. As a result, the bit lines BL/BL# associated with the non-written PMOS bit cells are pre-charged to the $V_{CCH}$ voltage by time T1.

At time T1, the select signal $SEL_A$ is de-activated high, thereby turning off PMOS select transistor 203, such that the bit line BL is isolated from the global bit line GBL (i.e., the bit line BL is left in a 'floating' condition). The global sense amplifier enable signal GSAEN is also de-activated at time T1. Also at time T1, the word line enable signal $WL_0$ is activated low, thereby enabling PMOS bit cell 207. (Note that the word line enable signal $WL_1$ remains deactivated high during the entire write access.) Under these conditions, the voltage on the bit line BL is pulled down slightly by the storage node voltage $V_{SN}$ of PMOS bit cell 207. Similarly, the voltage on the storage node $V_{SN}$ of PMOS bit cell 207 is pulled up slightly by the pre-charged voltage on the bit line BL, due to charge sharing between the bit line BL and the PMOS bit cell 207. Note that the bit line BL# continues to be pulled down to the ground supply voltage (via the global bit line GBL# and the turned on PMOS select transistor 204). Also note that between time T1 and T2, read voltages are developed on the bit lines BL associated with the non-written PMOS bit cells in the manner described above in connection with FIG. 3A.

Starting at time T2, the select signal $SEL_B$ is de-activated high, thereby turning off PMOS select transistor 204, such that the bit line BL# is isolated from the global bit line GBL#. Also at time T2, the sense amplifier 200 is enabled by driving the control voltages PS and NS toward the Vdd and ground supply voltages, respectively. In response to the voltage difference that exists across the bit lines BL and BL#, the sense amplifier 200 drives the bit line BL and the storage node voltage $V_{SN}$ toward the Vdd supply voltage (and drives the bit line BL# toward the ground supply voltage).

Also note that from starting at time T2, the sense amplifiers associated with the non-written PMOS bit cells in the same row are also enabled, thereby driving the voltages on the associated bit lines BL to the Vdd supply voltage or the ground supply voltage, depending on the data value stored in (read from) the non-written PMOS bit cell. During the write access, the select signal $SEL_A$ is not re-activated at time T4, thereby causing the bit lines BL associated with the non-written PMOS bit cells to remain isolated from the corresponding global bit lines GBL during the write access. As a result, the non-written PMOS bit cells are refreshed locally (i.e., from the associated sense amplifiers) rather than transmitting the read data to the associated global sense amplifiers. As a result, it is not necessary to enable the global sense amplifiers to complete the write access, and the global sense amplifier enable signal GSAEN remains de-activated low for the remainder of the write access.

At time T6, the global pre-charge signal GPRE is activated high and the write driver enable signal WDE is de-activated low, thereby pre-charging the global bit lines GBL and GBL# to the $V_{CCH}$ voltage prior to the start of the next access (i.e., by time T7).

As described above, the storage node voltage $V_{SN}$ of the PMOS bit cell being written starts to increase starting at time T1, and continues to increase until the end of the write access cycle at time T7. Because the storage node voltage $V_{SN}$ begins increasing so early in the write access cycle, there is adequate time for the storage node voltage $V_{SN}$ to reach the full Vdd supply voltage by the end of the write access cycle. In this manner, the late write problem associated with the prior art sense amplifier 100 is eliminated.

Figure 4B:
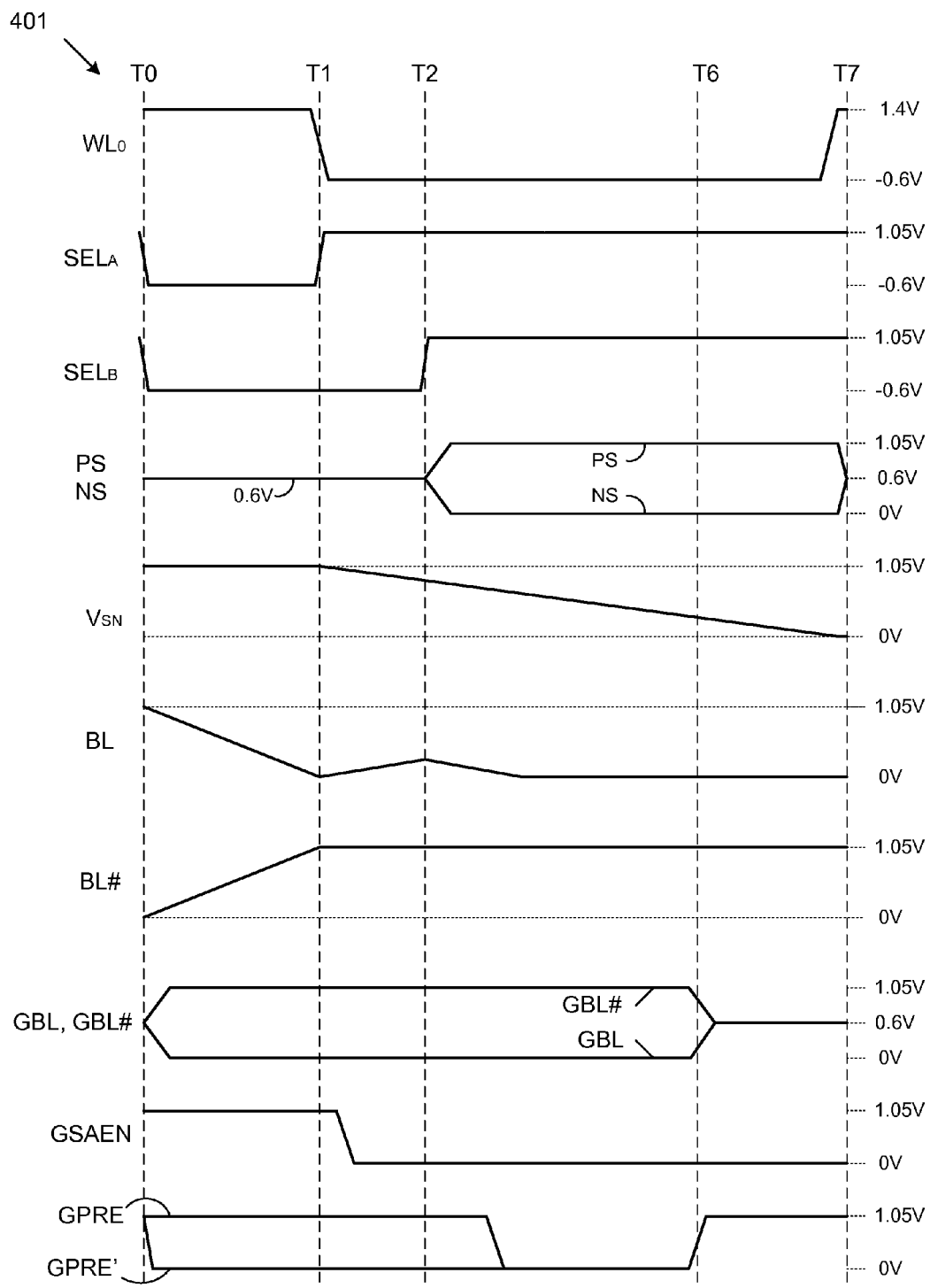

FIG. 4B is a waveform diagram 401 illustrating another write access to the PMOS bit cell 207. Waveform diagram 401 assumes that the storage node of PMOS bit cell 207 initially stores a logic high voltage (e.g., $V_{SN} \approx 1.05$ Volts), and that a logic low value is to be written to this PMOS bit cell 207 ($V_{SN} \approx 0$ Volts). Note that the bit line BL is pulled down starting at time T1, thereby providing adequate time to complete the write access by time T7.

Figure 4C:
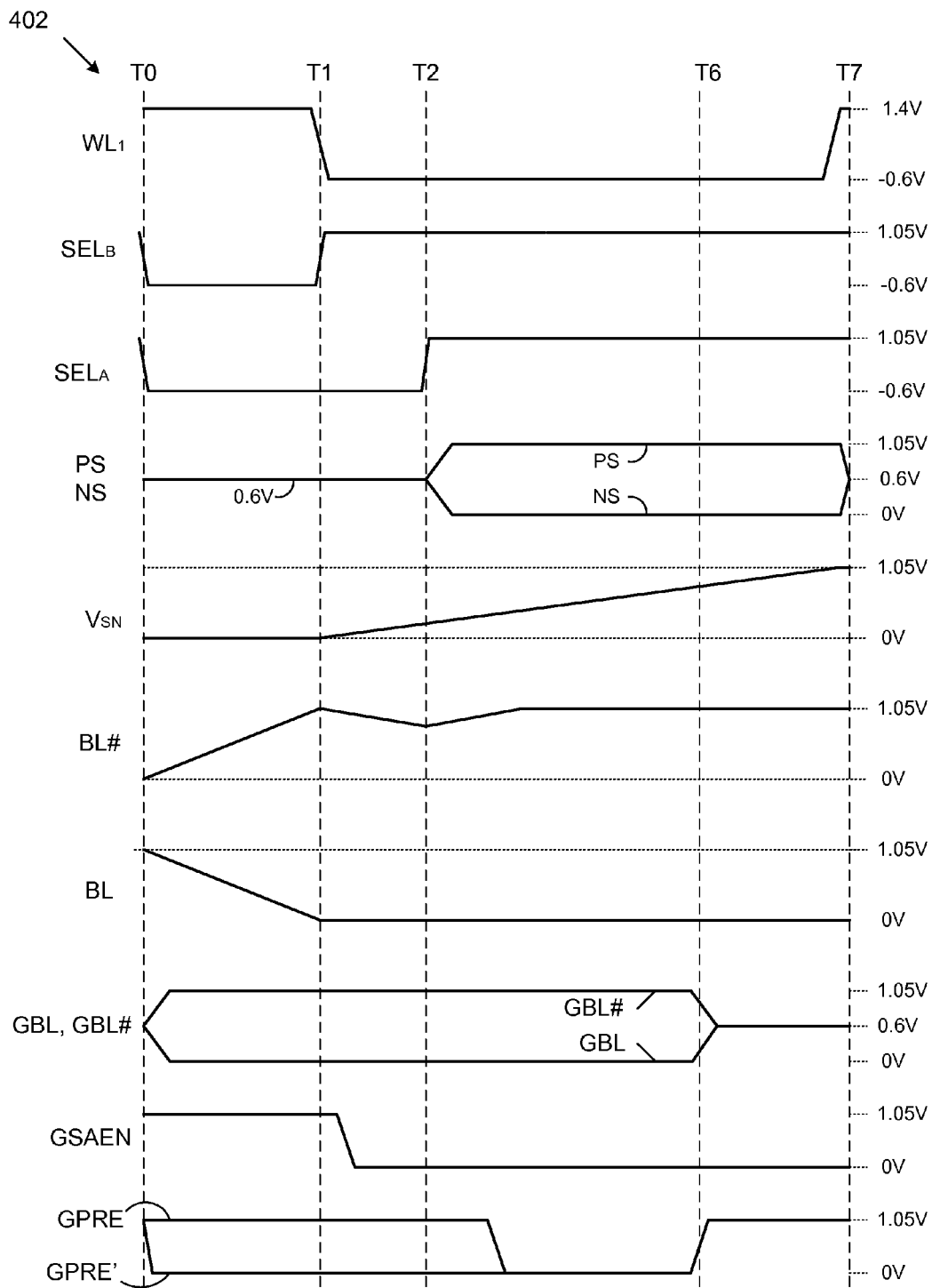

FIG. 4C is a waveform diagram 402 illustrating a write access to the PMOS bit cell 208. Waveform diagram 402 assumes that the storage node of PMOS bit cell 208 initially stores a logic low voltage ($V_{SN} \approx 0$ Volts), and that a logic high value is to be written to this PMOS bit cell 208 ($V_{SN} \approx 1.05$ Volts). The word line enable signal $WL_1$ is controlled in the same manner as the word line enable signal $WL_0$ in waveform diagrams 400-401 (and the word line enable signal $WL_0$ is de-activated for the duration of the write access associated with waveform diagram 402). The select signals $SEL_B$ and $SEL_A$ in waveform diagram 402 are controlled in the same manner as the select signals $SEL_A$ and $SEL_B$, respectively, in waveform diagrams 400-401. Moreover, the global bit lines GBL and GBL# are driven to the ground supply voltage and the Vdd supply voltage, respectively.

Figure 4D:
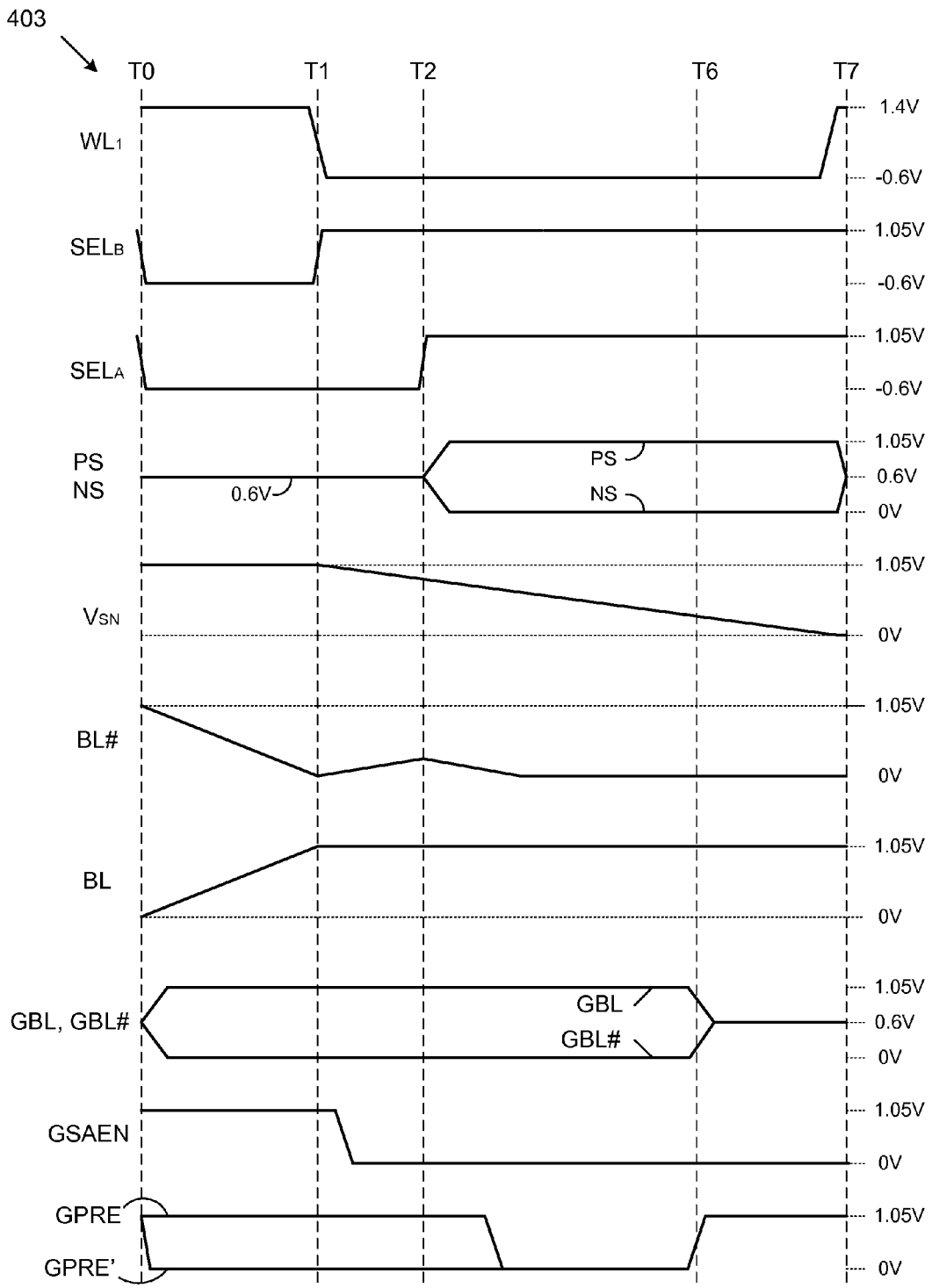

FIG. 4D is a waveform diagram 403 illustrating a write access to the PMOS bit cell 208. Waveform diagram 403 assumes that the storage node of PMOS bit cell 208 initially stores a logic high voltage ($V_{SN} \approx 1.05$ Volts), and that a logic low value is to be written to this PMOS bit cell 208 ($V_{SN} \approx 0$ Volts). Waveform diagram 403 is similar to waveform diagram 402 (but exhibits opposite logic states on the bit lines BL/BL#, the storage node voltage $V_{SN}$ and global bit lines GBL/GBL#).

An alternate embodiment of the present invention, which eliminates the 'read bump' from the read access cycle, will now be described.

Figure 5A:
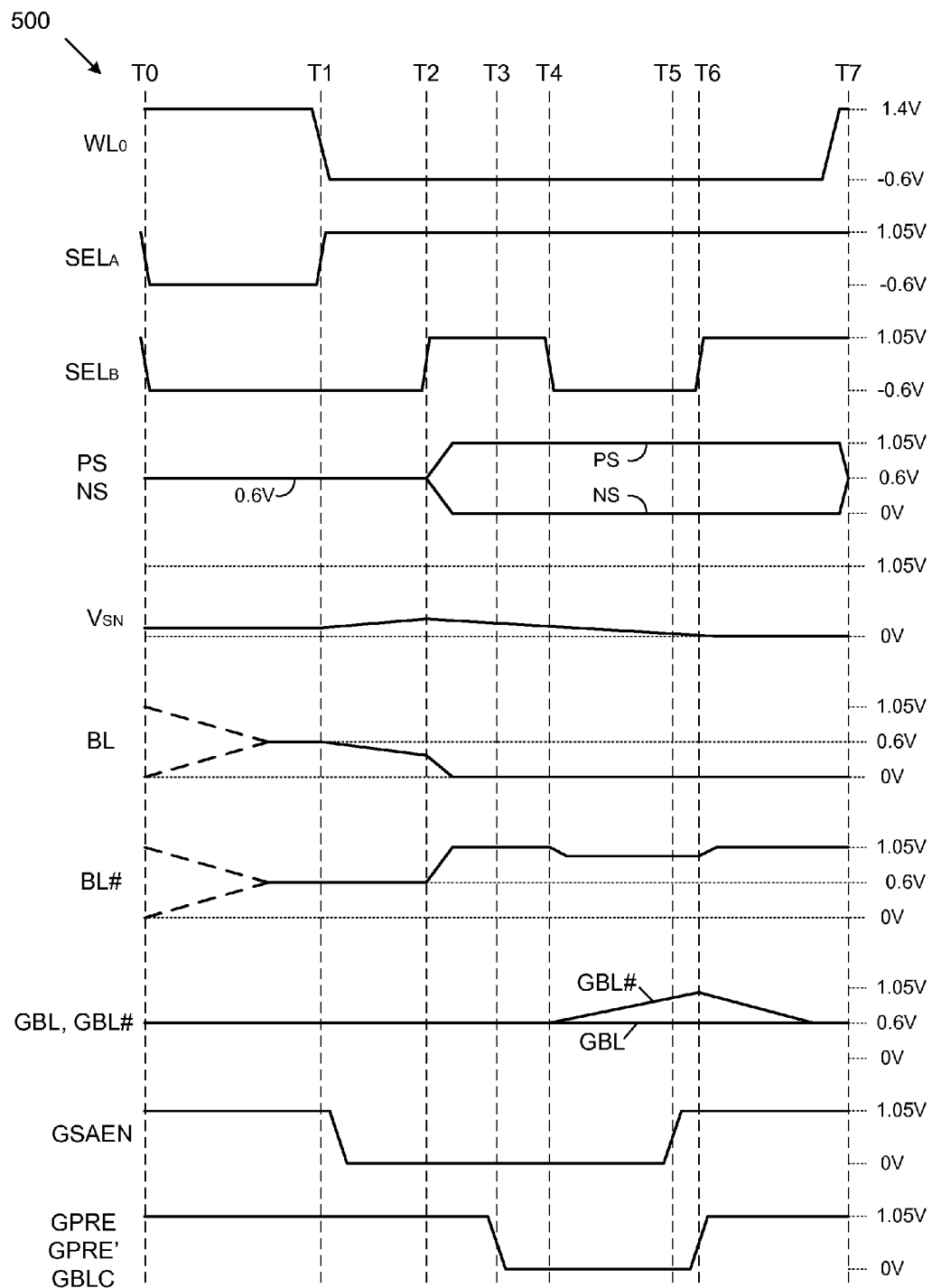
FIGS. 5A, 5B, 5C and 5D are waveform diagrams illustrating various read accesses implemented by the sense amplifier circuit of FIG. 2A and the global sense amplifier circuit of FIG. 2B in accordance with an alternate embodiment of the present invention.

FIG. 5A is a waveform diagram 500, which illustrates the manner in which the sense amplifier 200 can be operated in accordance with an alternate embodiment of the present invention. Waveform diagram 500 is substantially identical to waveform diagram 300 (FIG. 3A), with differences noted below. At time T4, the select signal $SEL_A$ is not activated low, such that the PMOS select transistor 203 of sense amplifier 200 remains off. As a result, the bit line BL is not coupled to the global bit line GBL, and the voltage on the bit line BL is maintained at the ground supply voltage (i.e., no 'read bump' exists on the bit line BL). Because the voltage on the selected bit line BL is not pulled up during the read access (as in FIG. 3A), the voltage storage node voltage $V_{SN}$ of PMOS bit cell 207 is pulled down to the ground supply voltage more quickly in waveform diagram 500. As a result, a faster read access cycle can be realized.

Also, at time T4, the select signal $SEL_B$ is activated low, thereby turning on PMOS select transistor 204 within sense amplifier 200. As a result, the bit line BL# is coupled to the global bit line GBL#. Under these conditions, the voltage on the global bit line GBL# is pulled up from the pre-charged voltage of $V_{CCH}$ (0.6 Volts) toward the Vdd supply voltage (1.05 Volts) by sense amplifier 200. Also at this time, the voltage on the bit line BL# is slightly pulled down from the Vdd supply voltage toward the pre-charge voltage $V_{CCH}$. That is, the 'read bump' exists on the reference bit line BL#, and not on the selected bit line BL. Because the PMOS select transistor 203 remains off at time T4, the voltage on the global bit line GBL remains at $V_{CCH}$ (0.6 Volts), such that a differential voltage is developed across the global bit lines GBL and GBL#, as illustrated. At time T5, the global sense amplifier enable signal GSAEN is activated high, thereby causing the global sense amplifier 260 to read (and latch) the signals developed on the global bit lines GBL and GBL#.

Figure 5B:
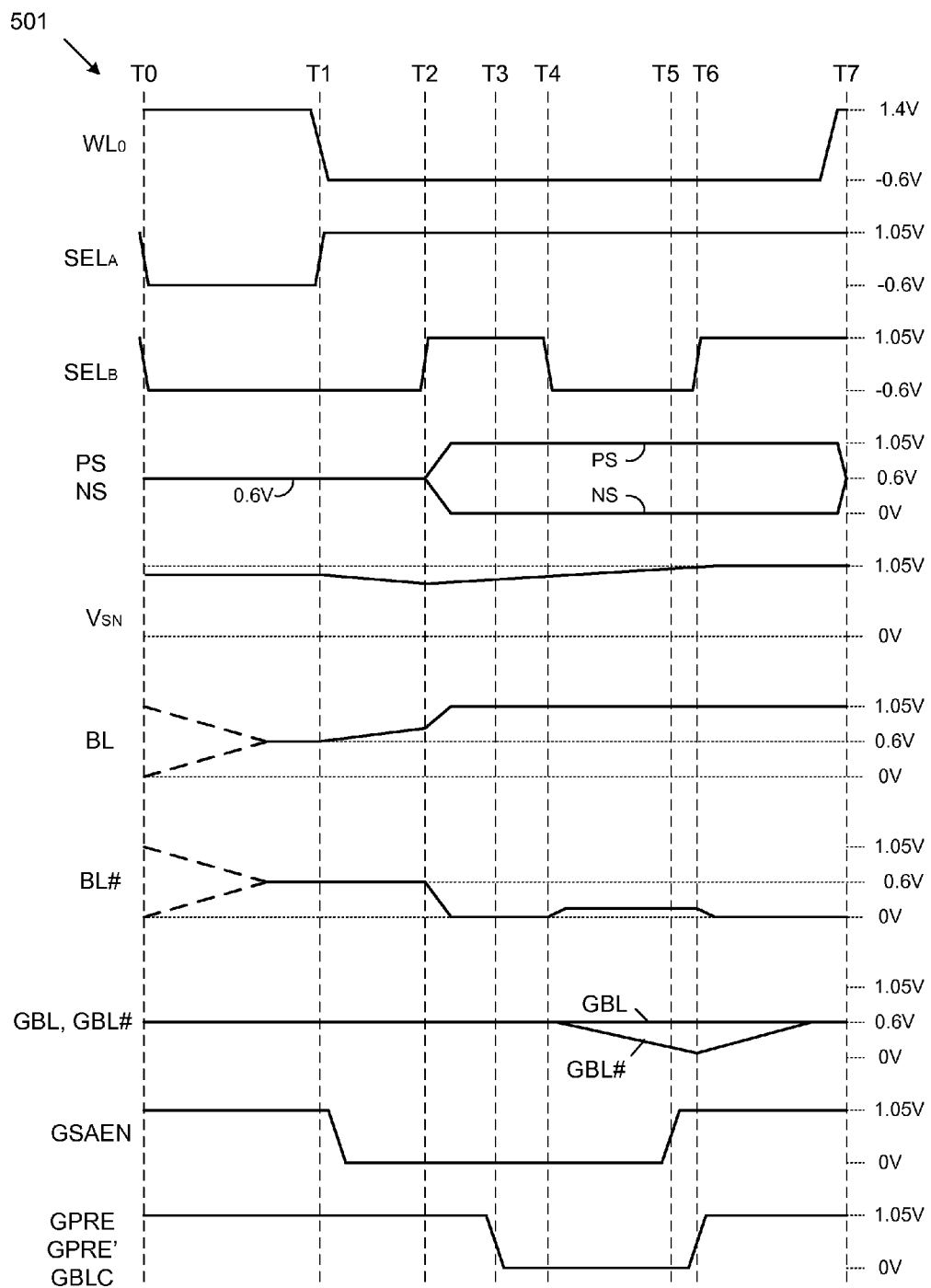

FIG. 5B is a waveform diagram 501 illustrating a read access to the PMOS bit cell 207 in accordance with the present embodiment, wherein the storage node of PMOS bit cell 207 stores a logic high voltage (e.g., $V_{SN} \approx 1.05$ Volts).

Figure 5C:
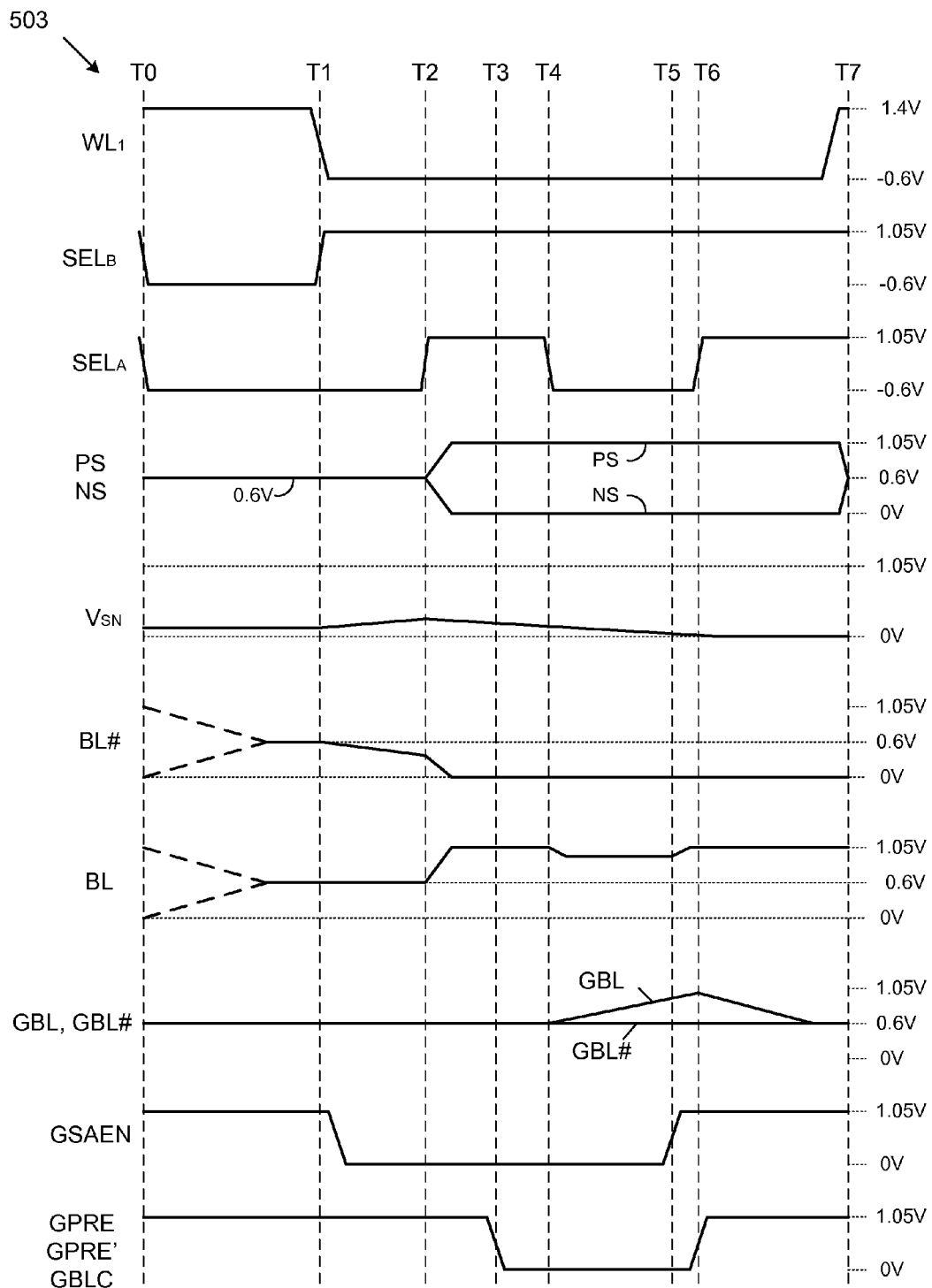

FIG. 5C is a waveform diagram 502 illustrating a read access to the PMOS bit cell 208 in accordance with the present embodiment, wherein the storage node of PMOS bit cell 208 stores a logic low voltage (e.g., $V_{SN} \approx 0$ Volts).

Figure 5D:
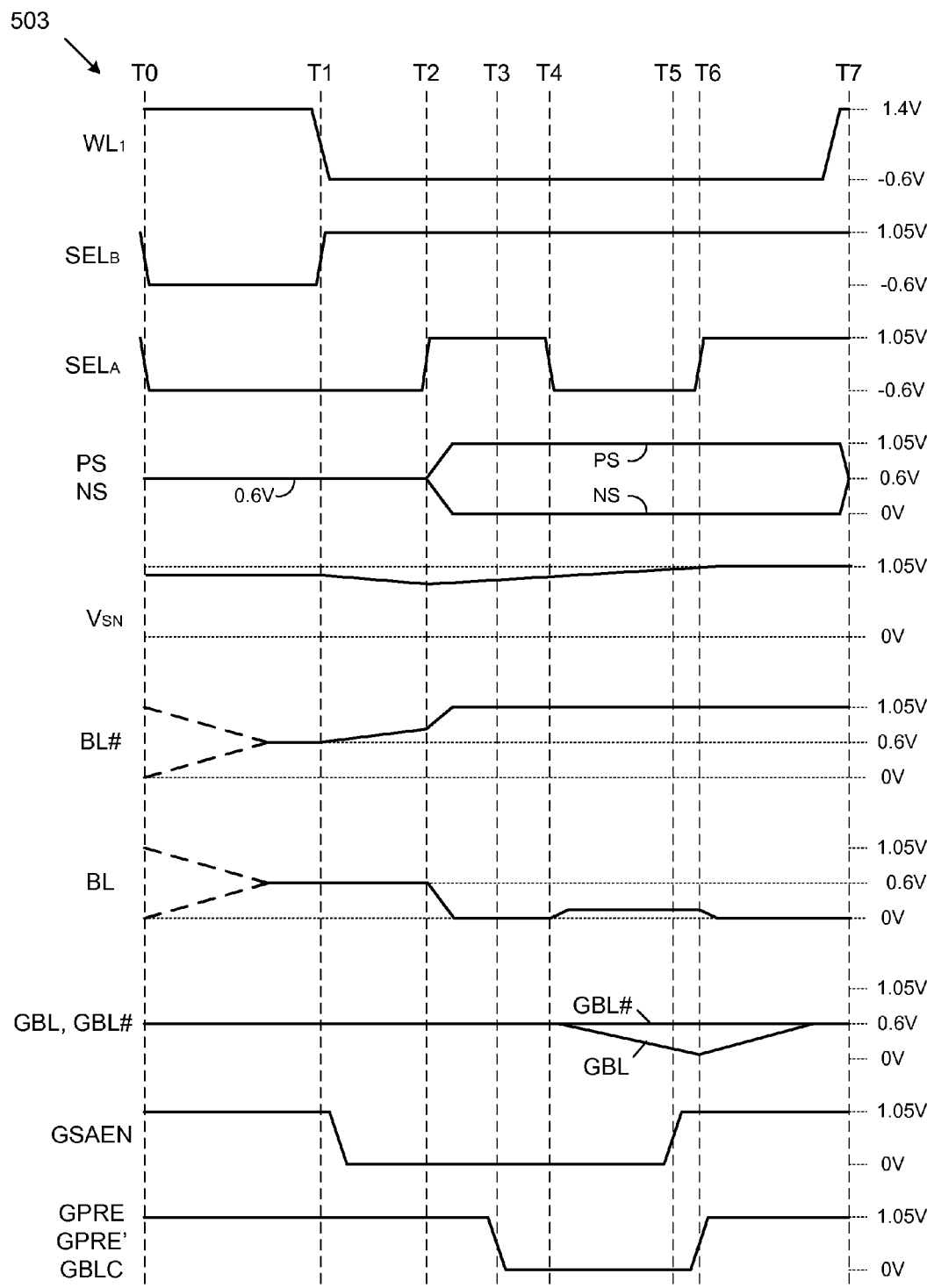

FIG. 5D is a waveform diagram 503 illustrating a read access to the PMOS bit cell 208 in accordance with the present embodiment, wherein the storage node of PMOS bit cell 208 stores a logic high voltage (e.g., $V_{SN} \approx 1.05$ Volts).

In accordance with an alternate embodiment of the present invention, the PMOS bit cells 207-208 can be replaced with NMOS bit cells (i.e., DRAM cells having NMOS access transistors). In this embodiment, the bit lines/global bit lines are controlled in a different manner. This embodiment is described in more detail below.

Figure 6A:
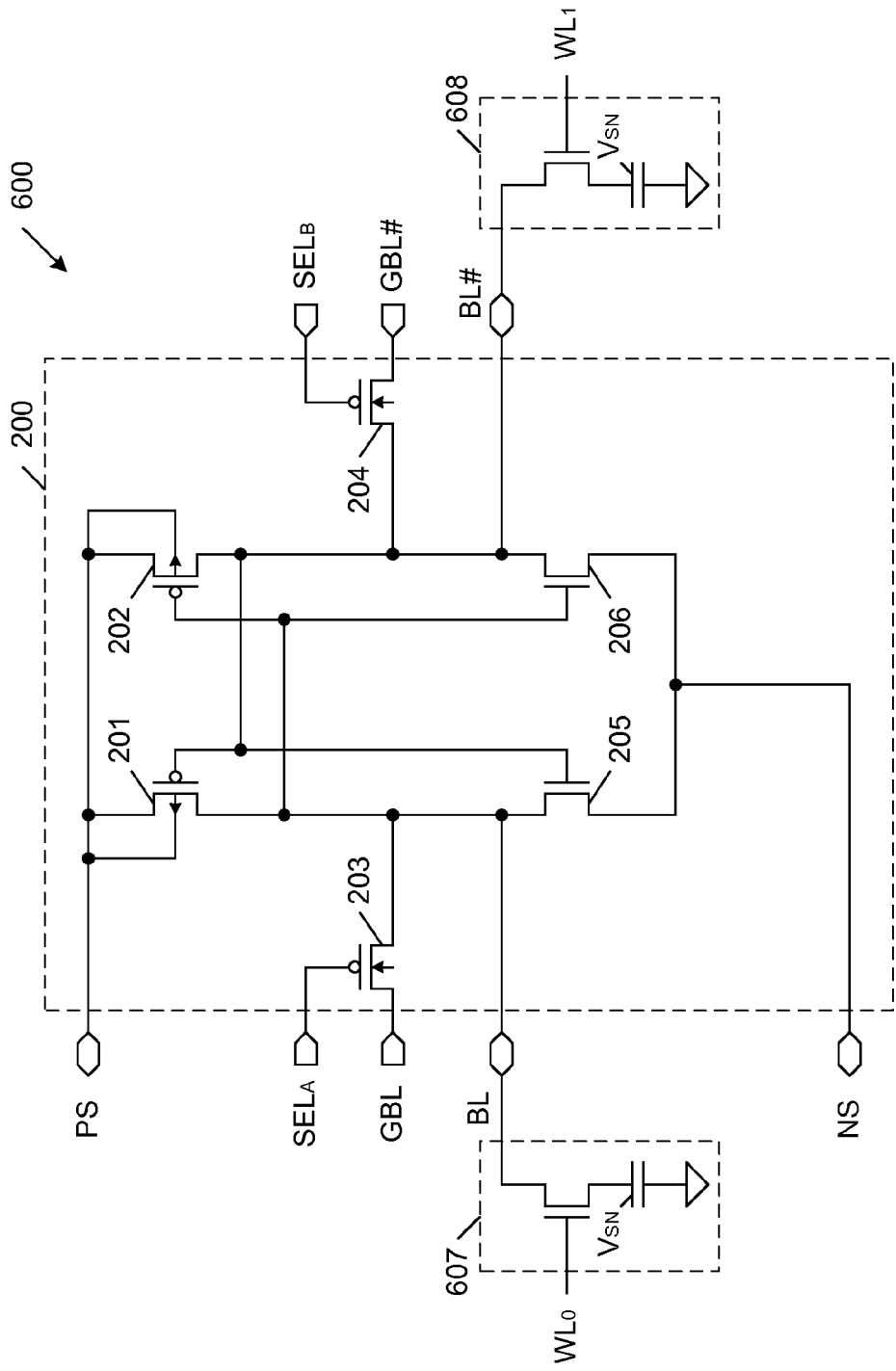
FIG. 6A is a circuit diagram of a six transistor (6T) sense amplifier circuit in accordance with an alternate embodiment of the present invention.

FIG. 6A is a circuit diagram that illustrates the sense amplifier 200 of FIG. 2A coupled to NMOS bit cells 607-608 to create a sense amplifier circuit 600. NMOS bit cells 607-608 include NMOS access transistors, as illustrated.

Figure 6B:
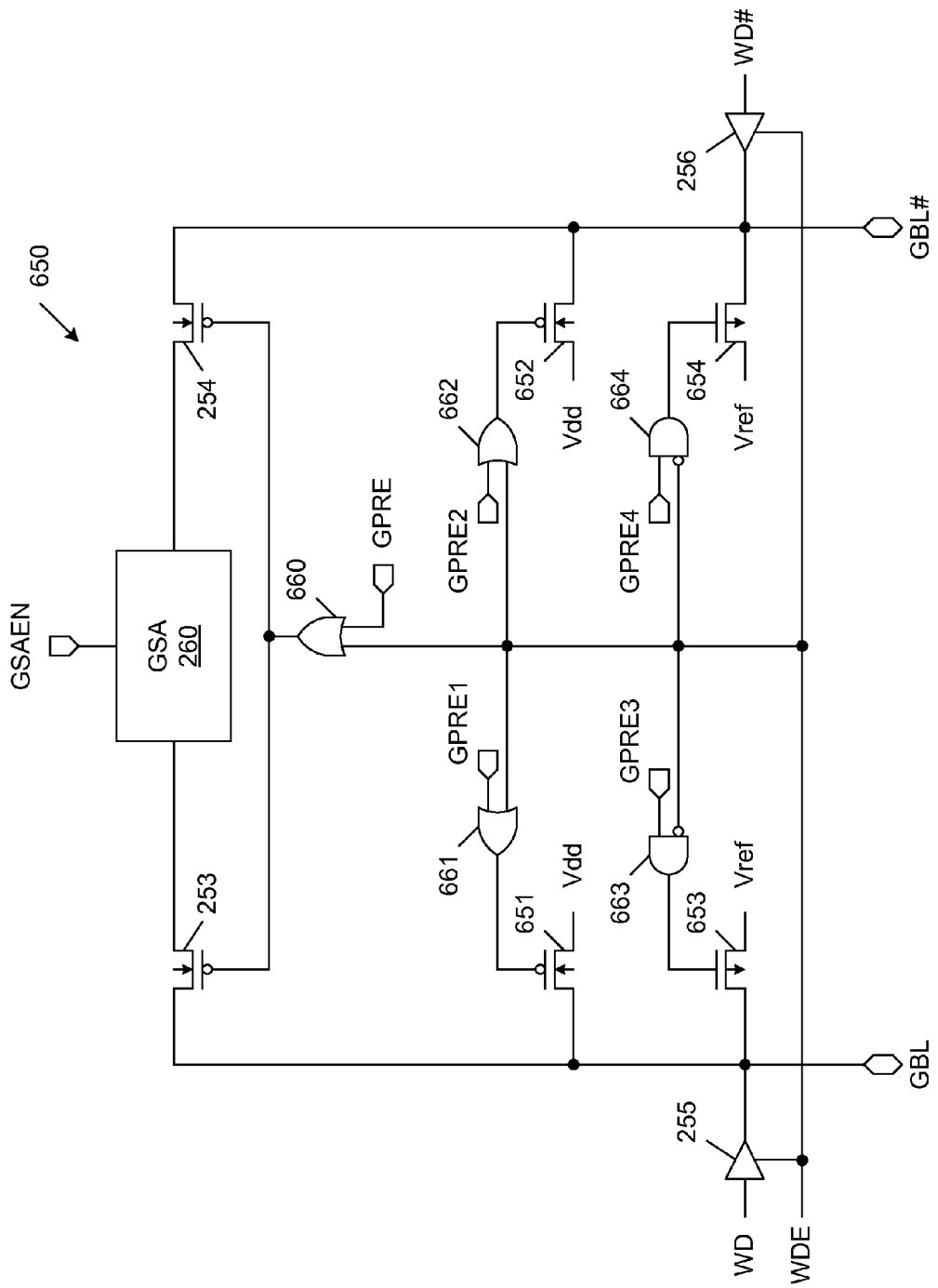
FIG. 6B is a circuit diagram of a global sense amplifier circuit, which is coupled to the sense amplifier circuit of FIG. 6A in accordance with one embodiment of the present invention.

FIG. 6B is a block diagram of a global sense amplifier/write driver circuit 650, which is coupled to the sense amplifier circuit 600 in accordance with one embodiment of the present invention. Global sense amplifier/write driver circuit 650 includes global sense amplifier 260, PMOS transistors 253-254, and write drivers 255-256, which are described above. In addition, global sense amplifier circuit includes PMOS transistors 651-652, NMOS transistors 653-654, logical OR gates 660-662 and logical AND gates 663-664. The sources of PMOS transistors 651 and 652 are coupled to receive the Vdd supply voltage, and the sources of NMOS transistors 653-654 are coupled to receive a reference voltage Vref. The drains of PMOS transistor 651 and NMOS transistor 653 are coupled to global bit line GBL, while the drains of PMOS transistor 652 and NMOS transistor 654 are coupled to global bit line GBL#.

The gates of PMOS transistors 651 and 652 are coupled to the outputs of OR gates 661 and 662, respectively. OR gates 661 and 662 have inputs coupled to receive global pre-charge signals GPRE1 and GPRE2, respectively. OR gates 661 and 662 are also coupled to receive the write driver enable signal WDE. The gates of NMOS transistors 653 and 654 are coupled to the outputs of AND gates 663 and 664, respectively. AND gates 663 and 664 have inputs coupled to receive global pre-charge signals GPRE3 and GPRE4, respectively. AND gates 663 and 664 are also coupled to receive the inverse of the write driver enable signal WDE. The gates of PMOS transistors 253 and 254 are coupled to the output of OR gate 660. The inputs of OR gate 660 are coupled to receive the global pre-charge signal GPRE and the write driver enable signal WDE.

In accordance with one embodiment, the reference voltage Vref is selected to be less than the Vdd supply voltage by a voltage that is greater than the distinguishing range of the sense amplifier 200. In the described examples, sense amplifier 200 is capable of distinguishing voltage differences of 100 mV or greater, and the reference voltage Vref is selected to have a voltage of 0.85 Volts, such that the difference between the Vdd supply voltage (1.05 Volts) and the reference voltage Vref is about 200 mV.

Figure 7A:
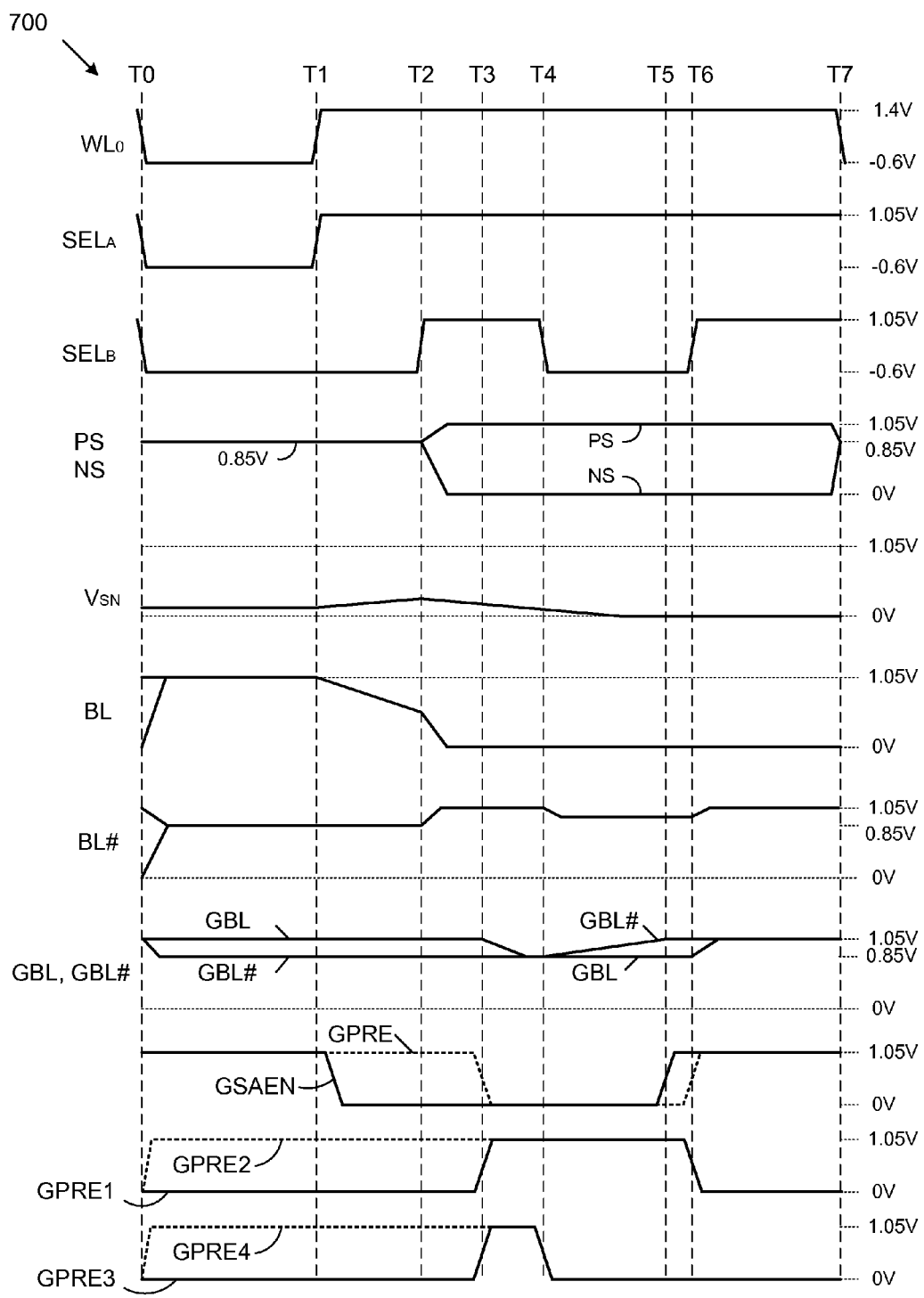
FIGS. 7A, 7B, 7C and 7D are waveform diagrams illustrating various read accesses implemented by the sense amplifier circuit of FIG. 6A and the global sense amplifier circuit of FIG. 6B in accordance with one embodiment of the present invention.

FIG. 7A is a waveform diagram 700 illustrating a read access implemented by sense amplifier circuit 600 and global sense amplifier circuit 650 in accordance with the present embodiment of the present invention. Waveform diagram 700 illustrates a read access to the NMOS bit cell 607. Waveform diagram 700 assumes that the storage node of NMOS bit cell 607 stores a logic low voltage ($V_{SN} \approx 0$ Volts). At the start of the read access cycle (T0), the word line signal $WL_0$ is de-activated low (note that the word line signal $WL_1$ is de-activated low throughout the entire read access). The write driver enable signal WDE is de-activated low, such that the OR gates 660, 661 and 662 route the global pre-charge signals GPRE, GPRE1 and GPRE2, respectively, and the AND gates 663 and 664 route the global pre-charge signals GPRE3 and GPRE4, respectively. Prior to time T0, the global pre-charge signals GPRE1 and GPRE2 are activated low, such that transistors 651 and 652 are turned on, and the global bit lines GBL and GBL# are driven to the Vdd supply voltage. The global pre-charge signal GPRE is deactivated high, thereby turning off PMOS transistors 253-254, such that the global sense amplifier 260 is isolated from the global bit lines GBL and GBL#. In addition, the global pre-charge signals GPRE3 and GPRE4 are de-activated low, such that NMOS transistors 653 and 654 are turned off at this time. The global sense amplifier signal GSAEN is already activated at time T0 to enable the global sense amplifier 260 to complete an access initiated during a previous cycle.

Starting from time T0, the global bit line that is not coupled to the bit cell being read is driven to the reference voltage Vref. Thus, in the present example, the global bit line GBL# (which is not coupled to the NMOS bit cell 607 being read), is driven to the reference voltage Vref. More specifically, the global pre-charge signal GPRE2 is de-activated high (thereby turning off PMOS transistor 652), and the global pre-charge signal GPRE4 is activated high (thereby turning on NMOS transistor 654). As a result, the global bit line GBL# is pre-charged to the reference voltage Vref through turned on NMOS transistor 654.

Also at time T0, the select signals $SEL_A$ and $SEL_B$ are activated low, thereby turning on PMOS transistors 203 and 204, respectively. As a result, bit lines BL and BL# are driven from their pre-existing states to the Vdd supply voltage and the reference voltage Vref, respectively. Note that at time T0, the control signals PS and NS are each held at the reference voltage Vref (0.85 V), such that the sense amplifier 200 is disabled.

By time T1, the bit lines BL and BL# have been driven to the Vdd supply voltage and the reference voltage Vref, respectively, (i.e., pre-charged) from the global bit lines GBL and GBL#. At time T1, the select signal $SEL_A$ is de-activated high, thereby turning off PMOS select transistor 203, effectively isolating the bit line BL from the global bit line GBL. Also at time T1, the word line signal $WL_0$ is activated high, thereby turning on the NMOS access transistor within NMOS bit cell 607. As a result, the low storage node voltage $V_{SN}$ of the NMOS bit cell 607 pulls the voltage on the bit line BL below the (pre-charged) Vdd supply voltage. The storage node voltage $V_{SN}$ is also pulled up slightly by the pre-charged bit line BL, as a result of charge sharing between the NMOS bit cell and the pre-charged bit line BL. The select signal $SEL_B$ remains activated low at time T1, such that PMOS transistor 204 remains on, and the voltage on complementary bit line BL# is still driven hard to the reference voltage Vref of 0.85 Volts. As a result, the signal loss on bit line BL is advantageously minimized.

Shortly after time T1, the global sense amplifier enable signal GSAEN is de-activated, thereby disabling the global sense amplifier 260 in preparation for the upcoming read access.

At time T2 (i.e., after the required read voltage has been developed on the bit line BL), the sense amplifier 200 is enabled by driving the control voltage PS toward the Vdd supply voltage (1.05 Volts), and driving the control voltage NS toward the ground supply voltage (0 Volts). The select signal $SEL_B$ is also de-activated high, thereby turning off PMOS transistor 204, and isolating bit line BL# from global bit line GBL#. Under these conditions, the voltage on the bit line BL is quickly pulled down to the ground supply voltage, and the voltage on the bit line BL# is quickly pulled up to the Vdd supply voltage (by sense amplifier 200). The ground supply voltage applied to the bit line BL pulls the storage node voltage $V_{SN}$ all the way to the ground supply voltage by the end of the read access cycle, thereby refreshing the NMOS bit cell 607.

At time T3, (i.e., while the select transistors 203-204 are both turned off) the global pre-charge signal GPRE1 is de-activated high, and the global pre-charge signal GPRE3 is activated high. As a result, PMOS transistor 651 is turned off, and NMOS transistor 653 is turned on, such that the global bit line GBL is driven from the Vdd supply voltage to the reference voltage Vref. As a result, both of the global bit lines GBL and GBL# are pre-charged to the reference voltage Vref by time T4.

Also at time T3, the global bit line pre-charge signal GPRE is activated low to turn on PMOS transistors 253 and 254, thereby coupling the global bit lines GBL and GBL# to the global sense amplifier 260.

At time T4, the global pre-charge signals GPRE3 and GPRE4 are deactivated low, thereby turning off transistors 653 and 654, such that the global bit lines GBL and GBL# are no longer driven to the reference voltage Vref. Also at time T4, the select signal $SEL_B$ is activated low, thereby turning on PMOS select transistor 204 to couple the bit line BL# to the global bit line GBL#. Under these conditions, the voltage on the global bit line GBL# is pulled up from the pre-charged reference voltage Vref toward the Vdd supply voltage. Note that the voltage on the bit line BL# is slightly pulled down in response to the pre-charged voltage Vref on the global bit line GBL#. However, the lowered voltage on the bit line BL# does not impede the pull down of the storage node voltage $V_{SN}$ toward the ground supply voltage (because this pull-down is implemented by the bit line BL). As a result, the 'read bump' is effectively eliminated.

At time T5, the global sense amplifier enable signal GSAEN is activated, thereby enabling global sense amplifier 260. As a result, global sense amplifier 260 amplifies (and latches) the signals developed on the global bit lines GBL/GBL#.

At time T6, the select signal $SEL_B$ is deactivated high, thereby turning off PMOS transistor 204 to isolate the bit line BL# from the global bit line GBL#. Also at time T6, the global pre-charge signals GPRE1 and GPRE2 are activated low, thereby applying the Vdd supply voltage to the global bit lines GBL and GBL#, thereby pre-charging these global bit lines to the Vdd supply voltage prior to the next access cycle, which begins at time T7. The global pre-charge signal GPRE is also de-activated high high at time T6, thereby turning off PMOS transistors 253-254, such that the global sense amplifier 260 is de-coupled from the global bit lines GBL/GBL#. Prior to time T7 (i.e., the end of the read access cycle), the PS and NS control signals are driven to the reference voltage Vref, thereby disabling the sense amplifier 200.

In addition to the advantages listed above, the read access represented by FIG. 7A advantageously results in improved drive on the global bit lines GBL and GBL#, which allows the pre-charge operation to be performed faster.

Figure 7B:
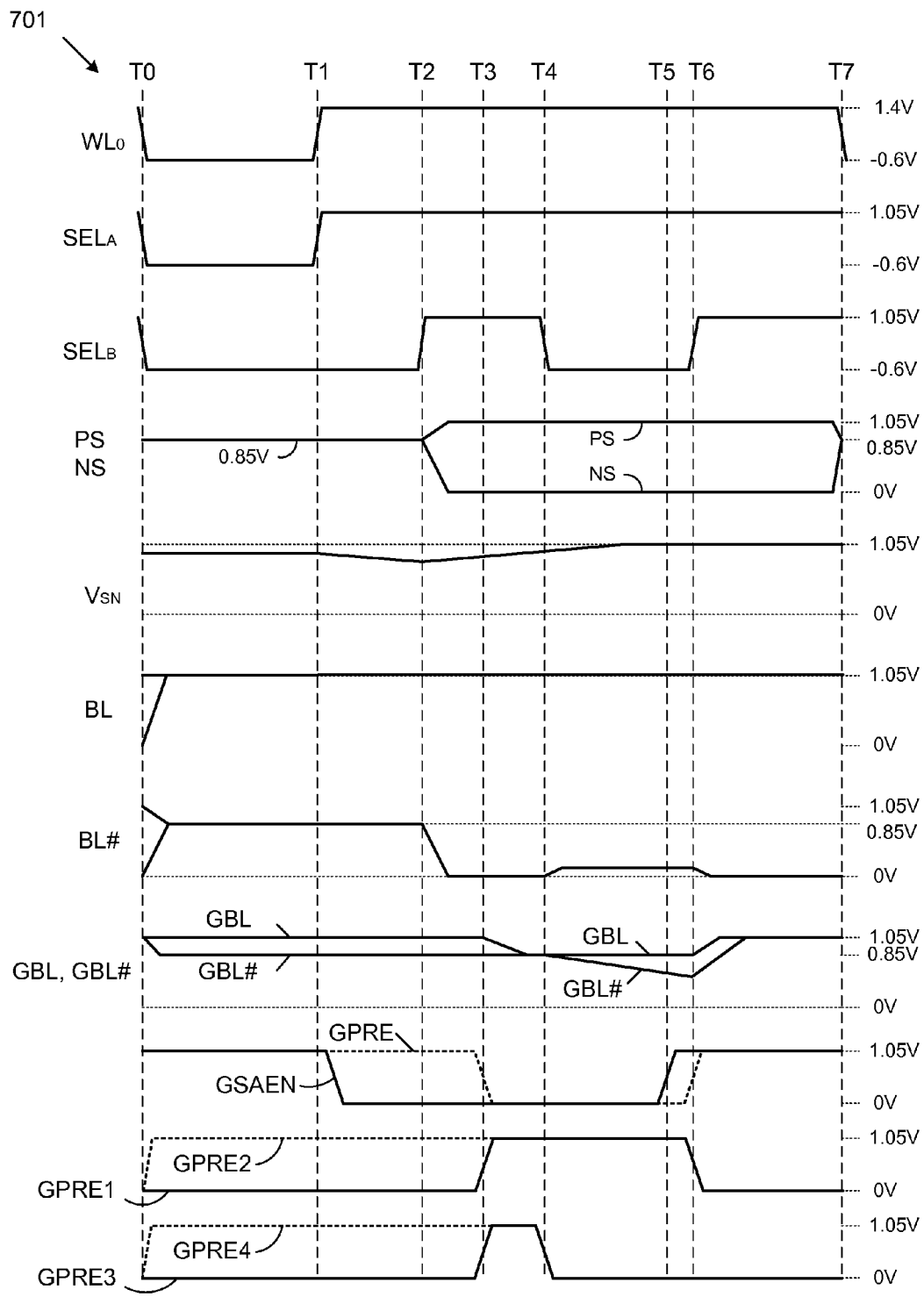

FIG. 7B is a waveform diagram 701 illustrating a read access to the NMOS bit cell 607, wherein the storage node of NMOS bit cell 607 stores a logic high voltage (e.g., $V_{SN} \approx 1.05$ Volts).

Figure 7C:
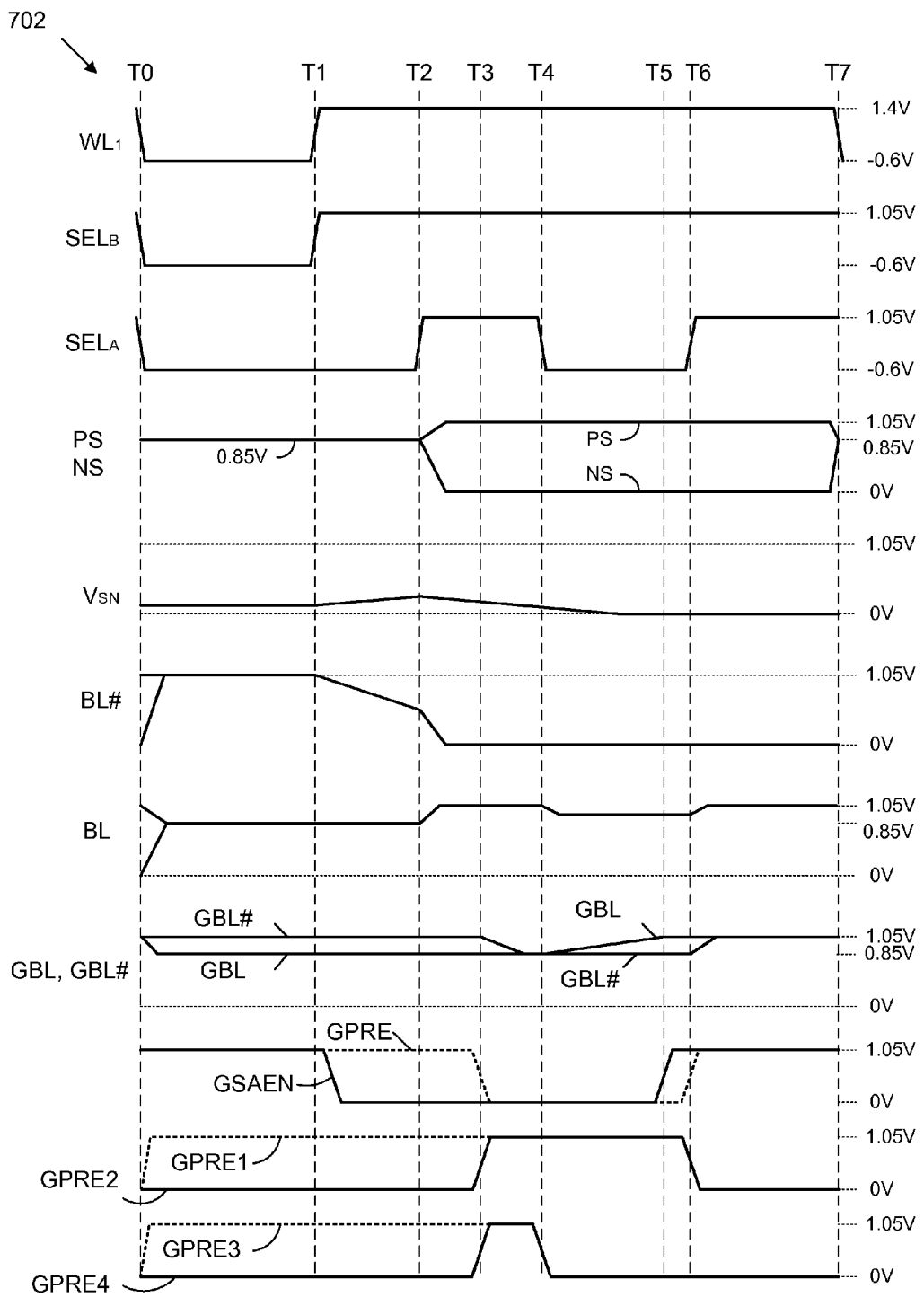

FIG. 7C is a waveform diagram 702 illustrating a read access to the NMOS bit cell 608, wherein the storage node of NMOS bit cell 608 stores a logic low voltage (e.g., $V_{SN} \approx 0$ Volts). The word line enable signal $WL_1$ is controlled in the same manner as the word line enable signal $WL_0$ in waveform diagrams 700-701 (and the word line enable signal $WL_0$ is de-activated for the duration of the read access associated with waveform diagram 702). The select signals $SEL_B$ and $SEL_A$ in waveform diagram 702 are controlled in the same manner as the select signals $SEL_A$ and $SEL_B$, respectively, in waveform diagrams 700-701.

Figure 7D:
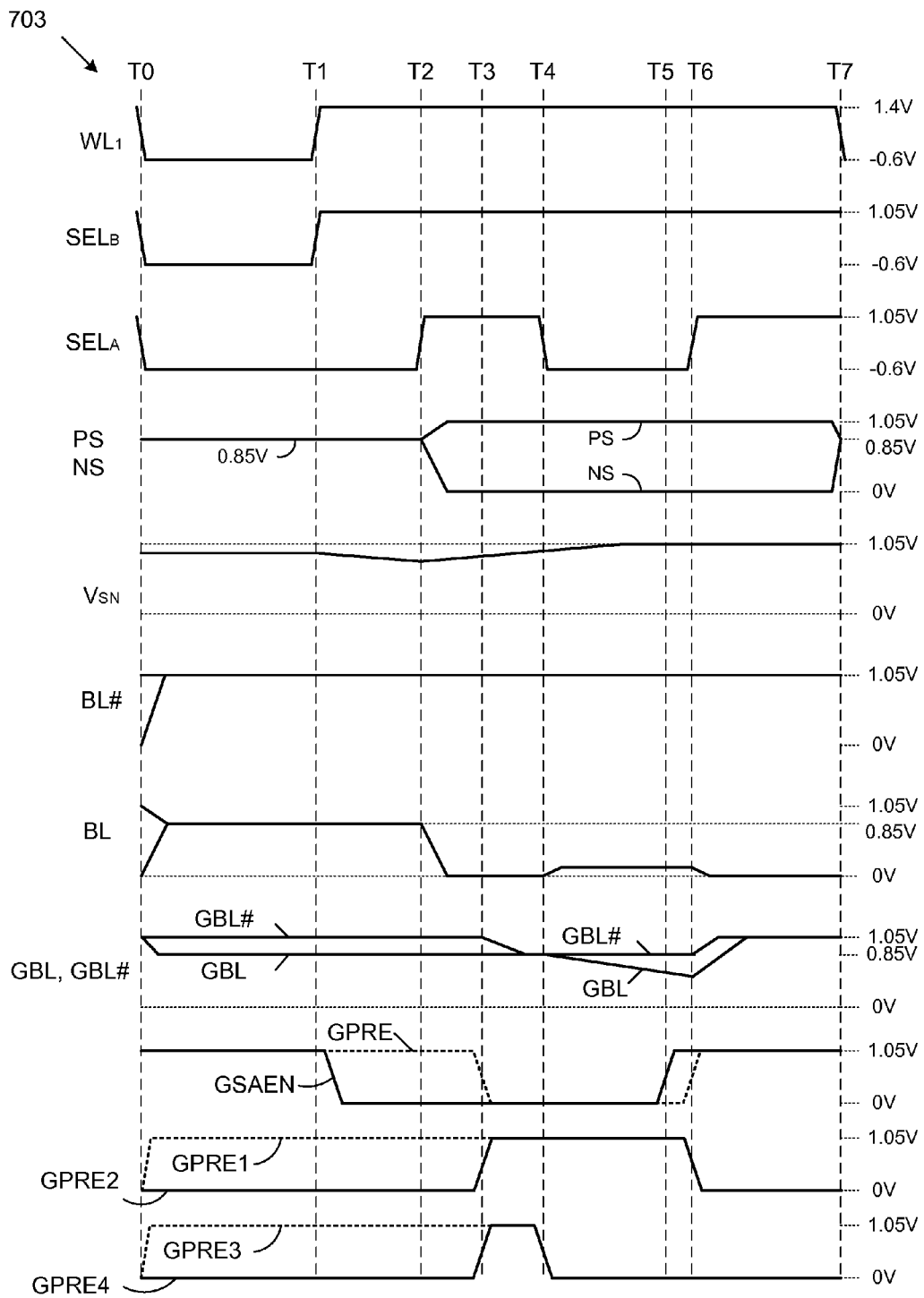

FIG. 7D is a waveform diagram 703 illustrating a read access to the PMOS bit cell 608, wherein the storage node of PMOS bit cell 608 stores a logic high voltage (e.g., $V_{SN} \approx 1.05$ Volts). Waveform diagram 703 is similar to waveform diagram 702 (but exhibits opposite logic states on the bit lines BL/BL#, the storage node voltage $V_{SN}$ and global bit line GBL#).

Note that sense amplifier circuit 600 and global sense amplifier/write driver circuit 650 implement write accesses in substantially the same manner as sense amplifier 200, except the polarity of the word line enable signal is reversed, and the control voltages PS and NS are held at the reference voltage Vref (rather than the $V_{CCH}$ voltage) when the sense amplifier 600 is disabled. The write driver enable signal WDE associated with bit cells to be written is activated to a logic high state during a write access. The logic high write driver enable signal WDE enables the write drivers 255-256 and turns off transistors 253-254 and transistors 651-654, thereby allowing the write data to be driven onto the associated global bit lines GBL and GBL#. The write driver enable signal(s) WDE associated with non-written bit cells of the write access are de-activated to a logic low state during the write access. These logic low write driver enable signal(s) cause the non-written bit cells in the same row as the written bit cells to be refreshed (read) during the write access.

Figure 8:
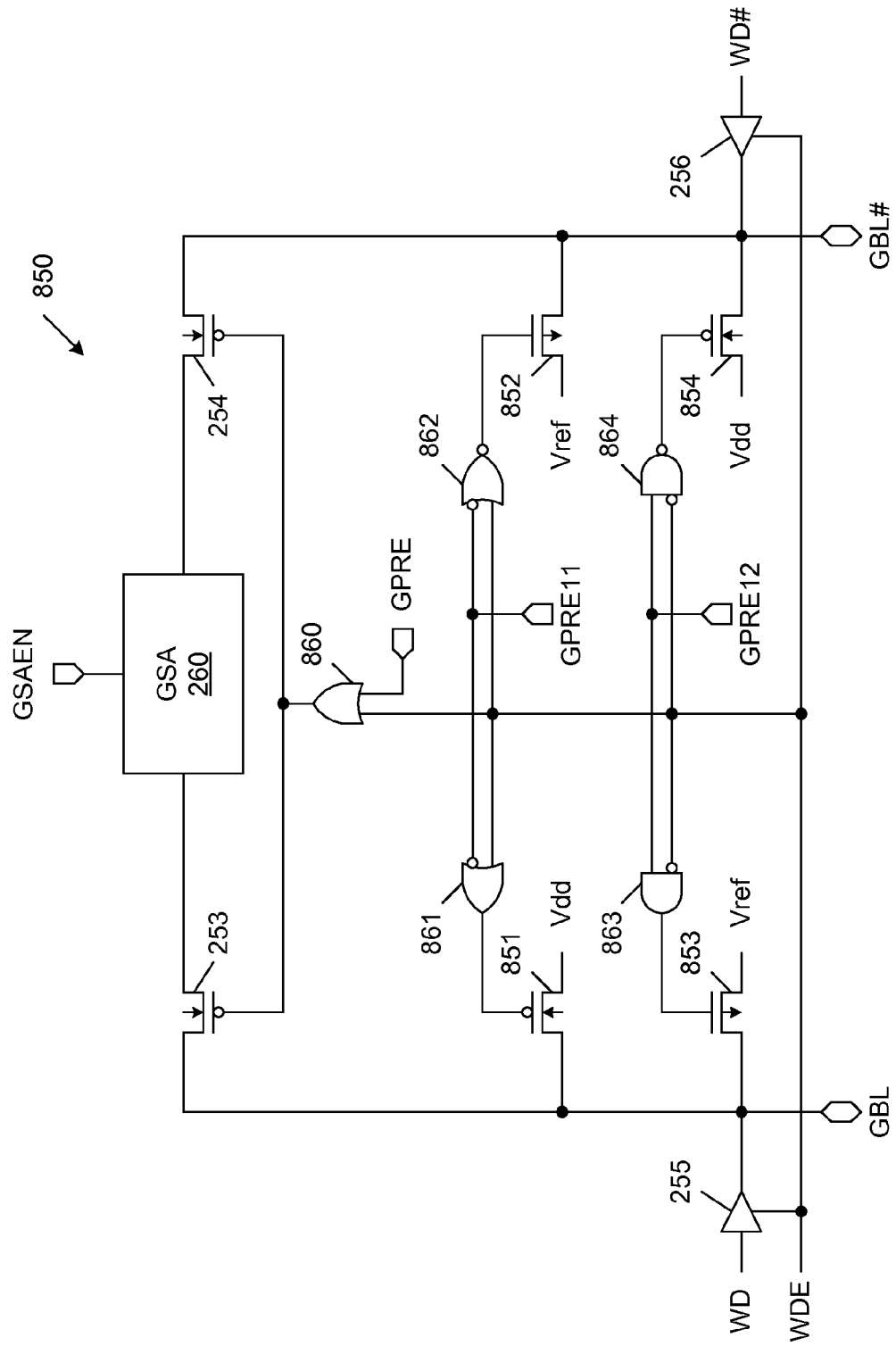
FIG. 8 is a block diagram of a global sense amplifier circuit, which is coupled to the sense amplifier circuit of FIG. 6A, in accordance with another embodiment of the present invention.

FIG. 8 is a block diagram of a global sense amplifier/write driver circuit 850, which is coupled to the sense amplifier circuit 600 (FIG. 6A) in accordance with another embodiment of the present invention. Global sense amplifier/write driver circuit 850 includes global sense amplifier 260, PMOS transistors 253-254 and write drivers 255-256, which are described above. In addition, global sense amplifier circuit 850 includes PMOS transistors 851 and 854, and NMOS transistors 852 and 853, OR gates 860-861, NOR gate 862, AND gate 863 and NAND gate 864, which are connected as illustrated. The sources of PMOS transistors 851 and 854 are coupled to receive the Vdd supply voltage, and the sources of NMOS transistors 852-853 are coupled to receive the reference voltage Vref (wherein the reference voltage Vref is selected in the same manner described above). The drains of transistors 851 and 853 are coupled to the global bit line GBL, while the drains of transistors 852 and 854 are coupled to the global bit line GBL#. The gates of transistors 851, 852, 853 and 854 are coupled to the outputs of OR gate 861, NOR gate 862, AND gate 863 and NAND gate 864, respectively. Inverting input terminals of OR gate 861 and NOR gate 862 are coupled to receive a first global pre-charge signal GPRE11, and non-inverting input terminals of OR gate 861 and NOR gate 862 are coupled to receive the write driver enable signal WDE. Input terminals of AND gate 863 and NAND gate 864 are coupled to receive a second global pre-charge signal GPRE12, and inverting input terminals of AND gate 863 and NAND gate 864 are coupled to receive the write driver enable signal WDE. The gates of PMOS transistors 253 and 254 are coupled to the output of OR gate 860, which has input terminals coupled to receive the global pre-charge signal GPRE and the write driver enable signal WDE.

Figure 9A:
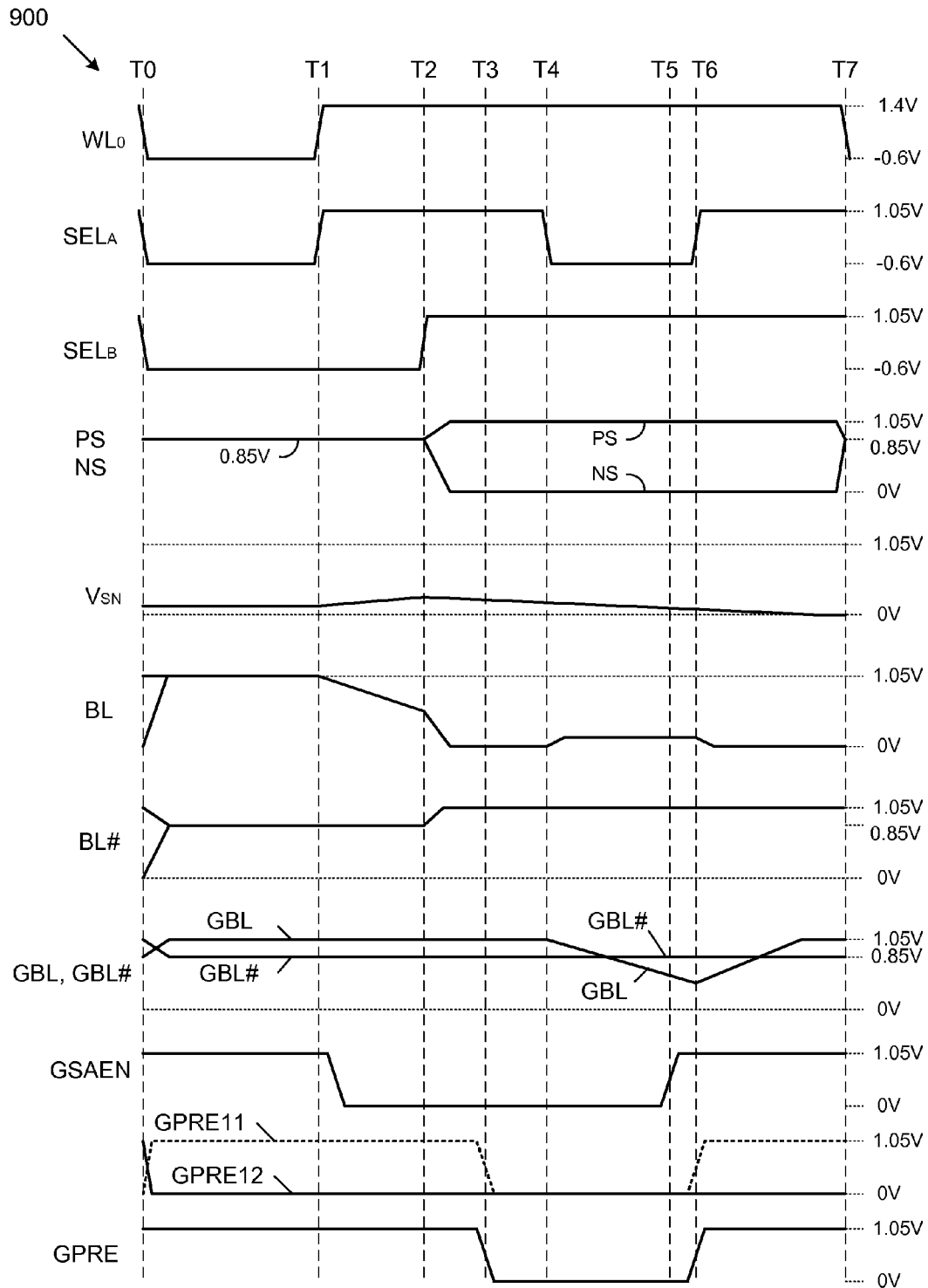
FIGS. 9A, 9B, 9C and 9D are waveform diagrams illustrating various read accesses implemented by the sense amplifier circuit of FIG. 6A and the global sense amplifier circuit of FIG. 8 in accordance with one embodiment of the present invention.

FIG. 9A is a waveform diagram 900 illustrating a read access implemented by sense amplifier circuit 600 and global sense amplifier/write driver circuit 850 in accordance with yet another embodiment of the present invention. Waveform diagram 900 illustrates a read access to the NMOS bit cell 607. Waveform diagram 900 assumes that the storage node of NMOS bit cell 607 stores a logic low voltage ($V_{SN} \approx 0$ Volts). At the start of the read access cycle (T0), the word line signal $WL_0$ is de-activated low (note that the word line signal $WL_1$ is de-activated low throughout the entire read access). The write driver enable signal WDE has a logic low state, such that OR gate 860 routes the global pre-charge signal GPRE, OR gate 861 routes the inverse of the first global pre-charge signal GPRE11, NOR gate 862 routes the first global pre-charge signal GPRE11, AND gate 863 routes the second global pre-charge signal GPRE12, and NAND gate 864 routes the inverse of second global pre-charge signal GPRE12.

Prior to time T0, one of the global pre-charge signals GPRE11 and GPRE12 is activated high, and the other one of the global pre-charge signals GPRE11 and GPRE12 is de-activated low. In the present example, it is assumed that the global pre-charge signal GPRE11 is initially low, and the global pre-charge signal GPRE12 is initially high. As a result, transistors 853-854 are initially on, such that the global bit lines GBL and GBL# are driven to the reference voltage Vref and the Vdd supply voltage, respectively. The global pre-charge signal GPRE is initially deactivated high, thereby turning off PMOS transistors 253-254, such that the global sense amplifier 260 is isolated from the global bit lines GBL and GBL#. The global sense amplifier signal GSAEN is already activated at time T0 to enable the global sense amplifier 260 to complete an access initiated during a previous cycle.

Starting from time T0, the global bit line that is coupled to the bit cell being read is driven to the Vdd supply voltage, while the global bit line that is not coupled to the bit cell being read is driven to the reference voltage Vref. Thus, in the present example, the global bit line GBL (which is coupled to the NMOS bit cell 607 being read) is driven to the Vdd supply voltage, while the global bit line GBL# (which is not coupled to the NMOS bit cell 607 being read), is driven to the reference voltage Vref. To accomplish this, the global pre-charge signal GPRE11 is activated high (thereby turning on transistors 851-852), and the global pre-charge signal GPRE12 is de-activated low (thereby turning off transistors 853-854).

Also at time T0, the select signals $SEL_A$ and $SEL_B$ are activated low, thereby turning on PMOS transistors 203 and 204, respectively. As a result, bit lines BL and BL# are driven from their pre-existing states to the Vdd supply voltage and the reference voltage Vref, respectively. Note that at time T0, the control signals PS and NS are each held at the reference voltage Vref (0.85 V), such that the sense amplifier 200 is disabled.

By time T1, the bit lines BL/BL# have been driven to the Vdd supply voltage and the reference voltage Vref, respectively, (i.e., pre-charged) from the global bit lines GBL and GBL#. At time T1, the select signal $SEL_A$ is de-activated high, thereby turning off PMOS transistor 203, effectively isolating the bit line BL from the global bit line GBL. Also at time T1, the word line signal $WL_0$ is activated high, thereby turning on the NMOS access transistor within NMOS bit cell 607. As a result, the low storage node voltage $V_{SN}$ of the NMOS bit cell 607 pulls the voltage on the bit line BL below the (pre-charged) Vdd supply voltage. The storage node voltage $V_{SN}$ is also pulled up slightly by the pre-charged bit line BL, due to charge sharing between bit line BL and the NMOS bit cell 607. The select signal $SEL_B$ remains activated low at time T1, such that PMOS transistor 204 remains on, and the voltage on complementary bit line BL# is driven hard to the reference voltage Vref of 0.85 Volts (and is therefore not affected by the voltage on bit line BL). As a result, the signal loss on bit line BL is advantageously minimized.

Shortly after time T1, the global sense amplifier enable signal GSAEN is de-activated, thereby disabling the global sense amplifier 260 in preparation for the upcoming read access.

At time T2 (i.e., after the required read voltage has been developed on the bit line BL), the sense amplifier 200 is enabled by driving the control voltage PS toward the Vdd supply voltage (1.05 Volts), and driving the control voltage NS toward the ground supply voltage (0 Volts). The select signal $SEL_B$ is also de-activated high, thereby turning off PMOS transistor 204, and isolating bit line BL# from global bit line GBL#. Under these conditions, the voltage on the bit line BL is quickly pulled down to the ground supply voltage, and the voltage on the bit line BL# is quickly pulled up to the Vdd supply voltage (by sense amplifier 200). The ground supply voltage applied to the bit line BL pulls the storage node voltage $V_{SN}$ all the way to the ground supply voltage by the end of the read access cycle, thereby refreshing the NMOS bit cell 607.

At time T3, (i.e., while the select transistors 203-204 are both turned off) the global pre-charge signal GPRE11 is de-activated low, thereby turning off transistors 851-852, such that the global bit lines GBL and GBL# are no longer actively driven to the Vdd supply voltage and the reference voltage Vref, respectively. Also at time T3, the global pre-charge signal GPRE is activated low, thereby turning on PMOS transistors 253 and 254, and coupling the global bit lines GBL and GBL# to the global sense amplifier 260.

At time T4, the select signal $SEL_A$ is activated low, thereby turning on PMOS select transistor 203 to couple the bit line BL to the global bit line GBL. Under these conditions, the voltage on the global bit line GBL is pulled down from the pre-charged Vdd supply voltage toward the ground supply voltage. Note that the voltage on the bit line BL is slightly pulled up in response to the pre-charged voltage Vdd on the global bit line GBL.

At time T5, the global sense amplifier enable signal GSAEN is activated, thereby enabling global sense amplifier 260. As a result, global sense amplifier 260 amplifies (and latches) the signals developed on the global bit lines GBL/GBL#.

At time T6, the select signal $SEL_A$ is deactivated high, thereby turning off PMOS transistor 203 to isolate the bit line BL from the global bit line GBL. At this time, the voltage on the bit line BL is pulled all the way down to the ground supply voltage (by sense amplifier circuit 200).

Also at time T6, the global pre-charge signal GPRE11 is activated high, thereby applying the Vdd supply voltage and the reference voltage Vref to global bit lines GBL and GBL#, respectively, thereby pre-charging these global bit lines prior to the next access cycle, which begins at time T7. Also at time T6, the global pre-charge signal GPRE is de-activated high, thereby turning off PMOS transistors 253-254, such that the global sense amplifier 260 is de-coupled from the global bit lines GBL/GBL#.

Prior to time T7 (i.e., the end of the read access cycle), the PS and NS control signals are driven to the reference voltage Vref, thereby disabling the sense amplifier 200.

The read access represented by FIG. 9A advantageously exhibits improved drive on the global bit lines GBL and GBL#. Moreover, the control of the global sense amplifier/write driver circuit 850 is advantageously simplified with respect to the global sense amplifier circuit 650.

Figure 9B:
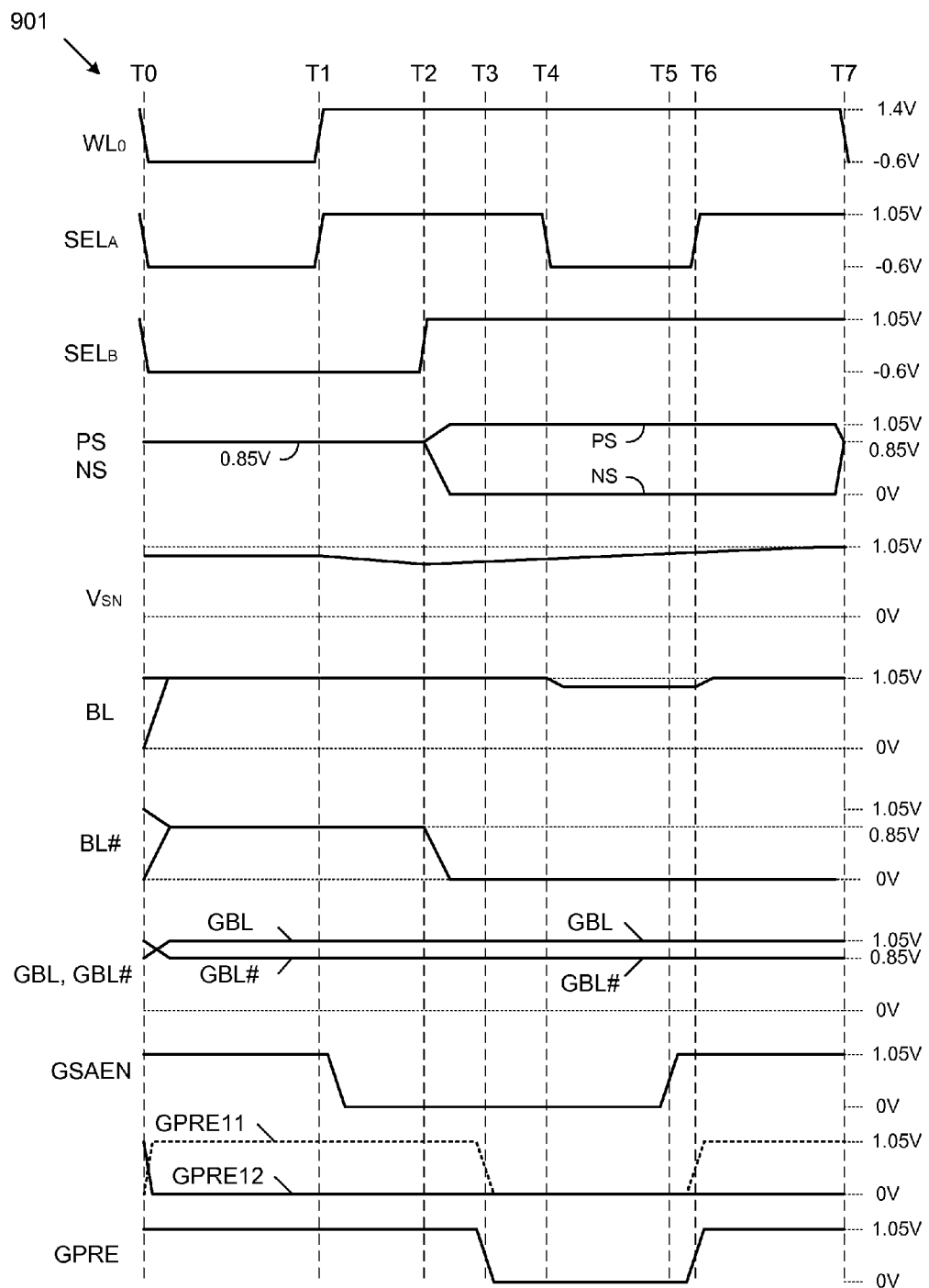

FIG. 9B is a waveform diagram 901 illustrating a read access to the NMOS bit cell 607, wherein the storage node of NMOS bit cell 607 stores a logic high voltage (e.g., $V_{SN} \approx 1.05$ Volts).

Figure 9C:
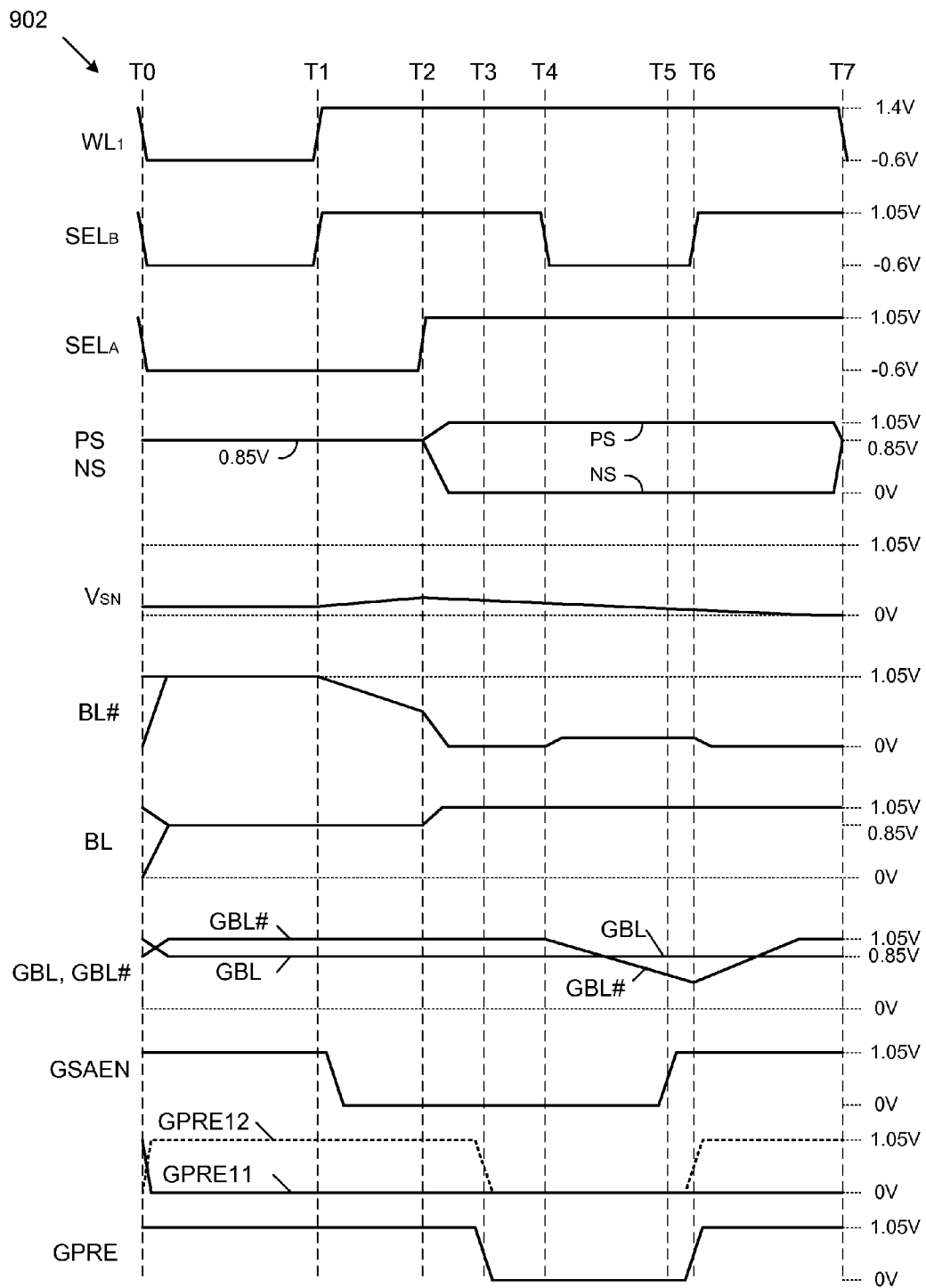

FIG. 9C is a waveform diagram 902 illustrating a read access to the NMOS bit cell 608, wherein the storage node of NMOS bit cell 607 stores a logic low voltage (e.g., $V_{SN} \approx 0$ Volts).

Figure 9D:
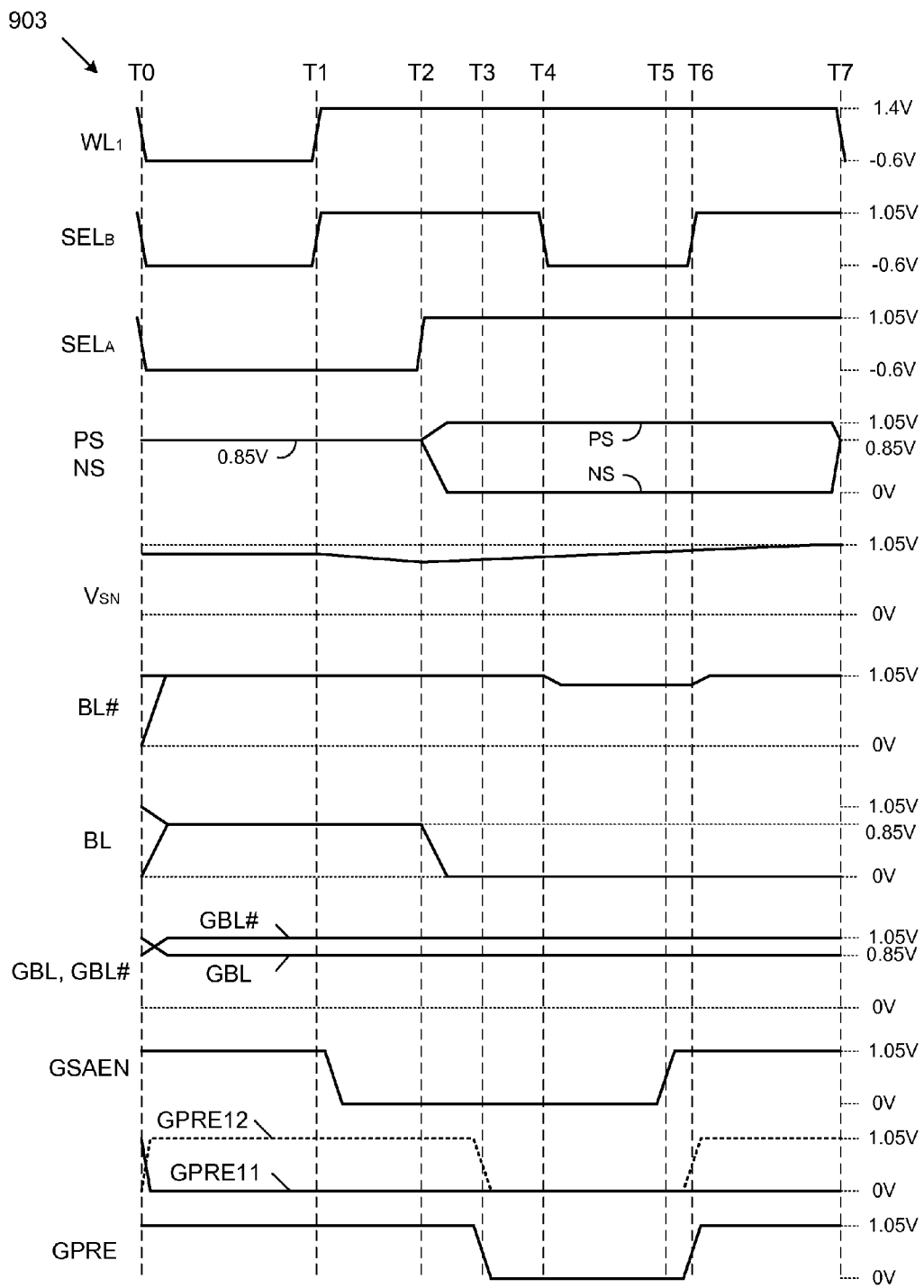

FIG. 9D is a waveform diagram 903 illustrating a read access to the NMOS bit cell 608, wherein the storage node of NMOS bit cell 608 stores a logic high voltage (e.g., $V_{SN} \approx 1.05$ Volts).

Note that sense amplifier circuit 600 and global sense amplifier/write driver circuit 850 implement write accesses in substantially the same manner as sense amplifier 200, except the polarity of the word line enable signal is reversed, and the control voltages PS and NS are held at the reference voltage Vref (rather than the $V_{CCH}$ voltage) when the sense amplifier 600 is disabled. The write driver enable signal WDE associated with bit cells to be written is activated to a logic high state during a write access. The logic high write driver enable signal WDE enables the write drivers 255-256 and turns off transistors 253-254 and transistors 851-854, thereby allowing the write data to be driven onto the associated global bit lines GBL and GBL#.

The write driver enable signal(s) WDE associated with non-written bit cells of the write access are de-activated to a logic low state during the write access. These logic low write driver enable signal(s) cause the non-written bit cells in the same row as the written bit cells to be refreshed (read) during the write access.

While the specification has been described in detail with respect to specific embodiments of the invention, it will be appreciated that those skilled in the art may readily conceive of various modifications, without departing from the spirit and scope of the present invention. For example, the following possibilities can be implemented, in any combination: NMOS or PMOS bit cells, Vdd or ground pre-charge voltages, and every pre-charge device may be implemented by NMOS or PMOS transistors, with proper biases. Accordingly, the present invention is limited only by the following claims.

We claim:

1. A method of accessing a dynamic random access memory (DRAM) cell comprising:
    driving a first bit line and a second bit line to a pre-charge voltage; then
    ceasing to drive the first bit line to the pre-charge voltage, and enabling a DRAM cell coupled to the first bit line, thereby developing a read voltage on the first bit line;
    continuing to drive the second bit line to the pre-charge voltage while the read voltage is developing on the first bit line; and then
    ceasing to drive the second bit line to the pre-charge voltage, and enabling a sense amplifier coupled to the first and second bit lines, whereby the sense amplifier drives the first bit line to a first supply voltage and the second bit line to a second supply voltage in response to the read voltage on the first bit line.

2. The method of claim 1, wherein the step of driving the first and second bit lines to the pre-charge voltage comprises:
    driving a first global bit line and a second global bit line to the pre-charge voltage;
    electrically connecting the first global bit line to the first bit line; and
    electrically connecting the second global bit line to the second bit line.

3. The method of claim 2, wherein the step of ceasing to drive the first bit line to the pre-charge voltage comprises electrically isolating the first bit line from the first global bit line.

4. The method of claim 3, wherein the step of ceasing to drive the second bit line to the pre-charge voltage comprises electrically isolating the second bit line from the second global bit line.

5. The method of claim 1, wherein the step of enabling the sense amplifier comprises:
    driving a first power supply terminal of the sense amplifier from the pre-charge voltage to the first supply voltage; and
    driving a second power supply terminal of the sense amplifier from the pre-charge voltage to the second supply voltage.

6. The method of claim 1, further comprising:
    pre-charging a first global bit line and a second global bit line to the pre-charge voltage; and then
    after the sense amplifier has driven the first bit line to the first supply voltage, coupling the first bit line to the first global bit line, thereby developing a global read voltage on the first global bit line; and
    electrically isolating the second bit line from the second global bit line while the global read voltage is developed on the first global bit line.

7. The method of claim 6, further comprising enabling a global sense amplifier coupled to the first and second global bit lines after developing the global read voltage on the first global bit line, whereby the global sense amplifier drives the first global bit line to the first supply voltage and the second global bit line to the second supply voltage in response to the global read voltage on the first global bit line.

8. The method of claim 6, wherein the pre-charge voltage is between the first supply voltage and the second supply voltage.

9. The method of claim 1, further comprising:
    pre-charging a first global bit line and a second global bit line to the pre-charge voltage; and then
    after the sense amplifier has driven the second bit line to the second supply voltage, coupling the second bit line to the second global bit line, thereby developing a global read voltage on the second global bit line; and
    electrically isolating the first bit line from the first global bit line while the global read voltage is developed on the second global bit line.

10. The method of claim 9, further comprising enabling a global sense amplifier coupled to the first and second global bit lines after developing the global read voltage on the second global bit line, whereby the global sense amplifier drives the first global bit line to the first supply voltage and the second global bit line to the second supply voltage in response to the global read voltage on the second global bit line.

11. A method of accessing a dynamic random access memory (DRAM) cell comprising:
    driving a first bit line to a first pre-charge voltage and driving a second bit line to a second pre-charge voltage, wherein the first pre-charge voltage is different than the second pre-charge voltage; then
    ceasing to drive the first bit line to the first pre-charge voltage, and enabling a DRAM cell coupled to the first bit line, thereby developing a read voltage on the first bit line;
    continuing to drive the second bit line to the second pre-charge voltage while the read voltage is developing on the first bit line; and then
    ceasing to drive the second bit line to the second pre-charge voltage, and enabling a sense amplifier coupled to the first and second bit lines, whereby the sense amplifier drives the first bit line to a first supply voltage and the second bit line to a second supply voltage in response to the read voltage on the first bit line.

12. The method of claim 11, wherein the step of driving the first and second bit lines to the pre-charge voltage comprises:
    driving a first global bit line to the first pre-charge voltage, and electrically connecting the first global bit line to the first bit line: and driving a second global bit line to the second pre-charge voltage, and electrically connecting the second global bit line to the second bit line.

13. The method of claim 12, wherein the step of ceasing to drive the first bit line to the first pre-charge voltage comprises electrically isolating the first bit line from the first global bit line.

14. The method of claim 13, wherein the step of ceasing to drive the second bit line to the second pre-charge voltage comprises electrically isolating the second bit line from the second global bit line.

15. The method of claim 12, further comprising:
charging the first and second global bit lines to the second pre-charge voltage after enabling the sense amplifier; then
coupling the second bit line to the second global bit line, thereby developing a global read voltage on the second global bit line; and
electrically isolating the first bit line from the first global bit line while the global read voltage is developed on the second global bit line.

16. The method of claim 15, further comprising enabling a global sense amplifier coupled to the first and second global bit lines after developing the global read voltage on the second global bit line.

17. The method of claim 16, wherein the global read voltage developed on the second global bit line is equal to the first pre-charge voltage.

18. The method of claim 11, wherein the first pre-charge voltage is equal to one of the first and second supply voltages, and the second pre-charge voltage is between the first supply voltage and the second supply voltage.

19. The method of claim 12, further comprising:
electrically isolating the first and second global bit lines from the first and second pre-charge voltages after enabling the sense amplifier; and then
coupling the first bit line to the first global bit line, thereby developing a global read voltage on the first global bit line.

20. The method of claim 19, further comprising enabling a global sense amplifier coupled to the first and second global bit lines after developing the global read voltage on the first global bit line.

21. The method of claim 19, wherein the global read voltage developed on the first global bit line is equal to the first pre-charge voltage.

22. The method of claim 19, wherein the global read voltage developed on the first global bit line is less than the second pre-charge voltage.

* * * * *